(12) United States Patent
Motoki

(10) Patent No.: US 12,401,944 B1
(45) Date of Patent: Aug. 26, 2025

(54) MICROPHONE SIGNAL CONVERSION MODULE AND MICROPHONE MODULE

(71) Applicant: Nisshinbo Micro Devices Inc., Tokyo (JP)

(72) Inventor: Naoyuki Motoki, Fujimino (JP)

(73) Assignee: Nisshinbo Micro Devices Inc., Tokyo (JP)

( * ) Notice: Subject to any disclaimer, the term of this patent is extended or adjusted under 35 U.S.C. 154(b) by 0 days.

(21) Appl. No.: 18/858,225

(22) PCT Filed: Jun. 29, 2023

(86) PCT No.: PCT/JP2023/024235
§ 371 (c)(1),
(2) Date: Oct. 18, 2024

(87) PCT Pub. No.: WO2025/004278
PCT Pub. Date: Jan. 2, 2025

(51) Int. Cl.
*H04R 3/00* (2006.01)
*H04R 19/00* (2006.01)
*H04R 19/04* (2006.01)

(52) U.S. Cl.
CPC ............. *H04R 3/00* (2013.01); *H04R 19/005* (2013.01); *H04R 19/04* (2013.01); *H04R 2201/003* (2013.01); *H04R 2410/03* (2013.01)

(58) Field of Classification Search
CPC ........ H04R 3/00; H04R 19/005; H04R 19/04; H04R 2201/003; H04R 2410/03
See application file for complete search history.

(56) References Cited

U.S. PATENT DOCUMENTS 4,644,292 A * 2/1987 Kunugi ................... H03G 5/18
330/149
6,147,979 A * 11/2000 Michel ................. H04M 9/082
379/406.06
(Continued)

FOREIGN PATENT DOCUMENTS

JP 2004120310 A 4/2004
JP 2012165376 A 8/2012
(Continued)

OTHER PUBLICATIONS

International Search Report and Written Opinion issued from the Japanese Patent Office in connection with PCT/JP2023/024235 on Oct. 3, 2023.
(Continued)

*Primary Examiner* — Oyesola C Ojo
(74) *Attorney, Agent, or Firm* — Christopher M. Scherer; Elizabeth L. Neal; DeWitt LLP

(57) ABSTRACT

A microphone signal conversion module includes: a buffer circuit to output a second analog signal obtained by carrying out a level conversion with a first gain on a first analog signal input from a transducer; an analog-to-digital conversion circuit to convert a level of the second analog signal with a second gain to a digital value; and a control circuit to control the first gain and the second gain. The second analog signal is input to the control circuit, and the control circuit is configured to control a magnitude of each of the first gain and the second gain in mutually opposite directions based on a level of the second analog signal.

14 Claims, 17 Drawing Sheets

(56) References Cited

U.S. PATENT DOCUMENTS

| | | | | |
|---|---|---|---|---|
| 2006/0188089 | A1* | 8/2006 | Diethorn | H04M 9/082 |
| | | | | 379/406.01 |
| 2012/0201400 | A1* | 8/2012 | Ayres | H03G 7/004 |
| | | | | 381/107 |
| 2015/0318833 | A1* | 11/2015 | Nielsen | H03G 3/20 |
| | | | | 381/107 |
| 2016/0087596 | A1* | 3/2016 | Yurrtas | H04R 1/04 |
| | | | | 381/111 |
| 2016/0157017 | A1* | 6/2016 | Lesso | G01P 15/125 |
| | | | | 381/71.7 |
| 2016/0344360 | A1* | 11/2016 | Kropfitsch | H03K 5/1536 |

FOREIGN PATENT DOCUMENTS

| | | |
|---|---|---|
| JP | 2015530024 A | 10/2015 |
| KR | 20160005721 A | 1/2016 |

OTHER PUBLICATIONS

Korean Decision to Grant a Patent received for Korean Patent Application No. 10-2024-7034040 mailed on Dec. 23, 2024, 5 pages (2 pages of English Translation and 3 pages of Official Copy).
"Extended European Search Report received for European Application No. EP23932312.4, mailed on Apr. 23, 2025", 6 pages.

* cited by examiner

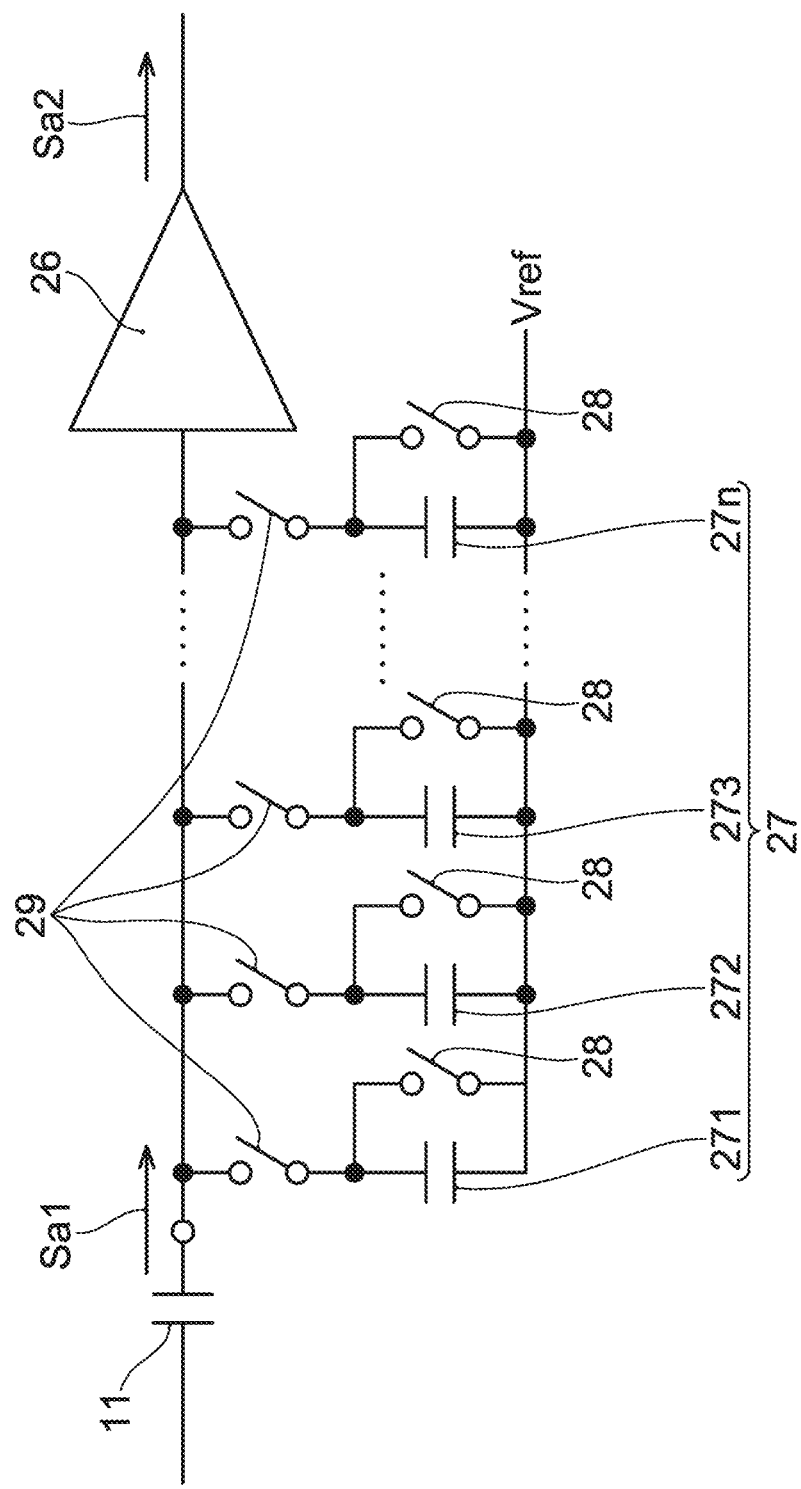

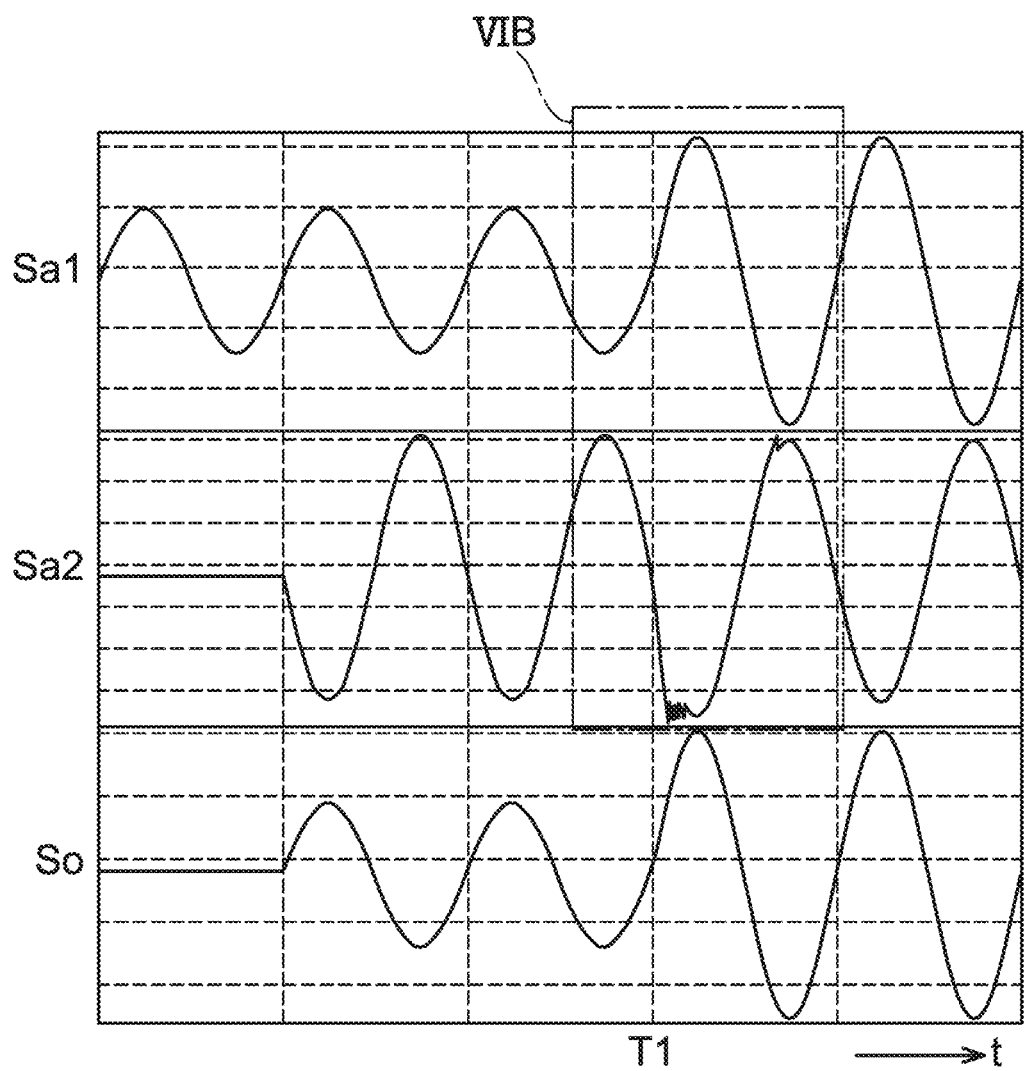

MICROPHONE SIGNAL CONVERSION MODULE AND MICROPHONE MODULE

CROSS-REFERENCE TO RELATED APPLICATIONS

The present application is the U.S. National Stage application of International Application No. PCT/JP2023/024235, filed Jun. 29, 2023, the contents of which are incorporated herein by reference in their entirety.

TECHNICAL FIELD

The present invention relates to a microphone signal conversion module and a microphone module.

BACKGROUND ART

Conventionally, transducers to convert various types of energy into different types of energy are widely used regardless of whether they are used for industrial or consumer applications. Microphones exist as one form of such a transducer. With the development of interactive devices due to the rapid progress of natural language processing technologies and voice recognition technologies in recent years, the usefulness of microphone devices and the demand for microphones are increasing. A transducer that functions as a microphone senses sound and converts the sensed sound into an analog electrical signal. Accordingly, in such a device as a microphone device shown in Patent document 1, for example, an electrical signal generated by a microphone in many applications is converted to a digital signal and input to a signal processing device such as a microcomputer and the like.

PRIOR ART DOCUMENT

Patent Document

Patent Document 1: JP 2004-120310 A

SUMMARY OF THE INVENTION

Problem to be Solved by the Invention

In such a device as one shown in Patent document 1, in which device an analog electrical signal such as an audio signal is converted into a digital signal, an electrical signal input from a microphone and the like is, before a conversion thereof, amplified to a level suitable for an analog-to-digital converter (an AD converter). For such an electronic module to carry out a conversion of the level, form, and the like of an analog signal, ensuring a sufficient signal-to-noise ratio (SN ratio) is required so that a signal sensed by the microphone is not buried in noise such as conversion errors and the like.

On the other hand, low voltage and low current consumption operations are often required for an electronic module to carry out amplification, conversion, and the like of signals of a small transducer such as a MEMS (Micro-electromechanical systems) microphone, for example. Moreover, to meet a continuous demand on miniaturization for various devices provided with a microphone, a demand on miniaturization for the microphone electronic module itself also exists constantly. With such a low voltage and low current consumption, small-sized electronic module to carry out amplification, conversion, and the like of signals from a microphone, ensuring a sufficient SN ratio can be theoretically difficult.

It is considered to increase the gain of a pre-stage amplifier (a preamplifier) 901 of an AD converter 910 in a microphone amplifier 900 as shown in FIG. 8A, for example, as one means to increase the SN ratio. The AD converter 910 is a general delta-sigma type AD converter, and comprises a subtractor 902, an integrator 903, a quantizer 904, and a 1-bit DA converter 905.

By increasing the gain of the preamplifier 901, a signal input to the AD converter 910 can be increased to increase the apparent SN ratio. However, in a case that the gain of the preamplifier 901 is increased in such a manner, when the amplitude of an input signal Vi is large, an output signal Vo may become saturated as a signal Voa shown in FIG. 8B. Besides, the signal Voa shown in FIG. 8B is an analog signal obtained by passing the output signal Vo of the AD converter 910 through a suitable low-pass filter (An output signal So and the output signal Voa that are shown in each of FIGS. 6A, 9, and 10 sequentially referenced below are also, similarly, output signals after passing through a low-pass filter).

In other words, in FIG. 8B, a signal Via input to the AD converter 910 is saturated near the extreme values of the amplitude of the input signal Vi (in P parts in FIG. 8B). As a result, a suitable conversion operation is not carried out in the delta-sigma type AD converter 910, and the signal Voa is not able to reproduce the input signal Vi. In this way, when the gain of the pre-stage amplifier of the AD converter is merely increased to improve the SN ratio, the dynamic range may be reduced. Therefore, there is a problem that, with the electronic module to handle microphone signals, it is difficult to sufficiently provide the performance required in both the SN ratio and dynamic range.

In view of such problems, an object of the present invention is to make it possible to convert an analog signal from a transducer to a digital value without sacrificing the dynamic range and also with a good SN ratio.

Means to Solve the Problem

A microphone signal conversion module of one embodiment of the present invention comprises a buffer circuit to carry out a level conversion with a first gain on a first analog signal input from a transducer and to output a second analog signal obtained by the level conversion; an analog-to-digital conversion circuit to convert a level of the second analog signal with a second gain to a digital value; and a control circuit to control the first gain and the second gain. The second analog signal is input to the control circuit, and the control circuit is configured to control a magnitude of each of the first gain and the second gain in mutually opposite directions based on a level of the second analog signal.

A microphone module of one embodiment of the present invention comprises the above-described microphone signal conversion module, and a MEMS transducer to generate the first analog signal.

Effects of the Invention

The microphone signal conversion module and the microphone module of the present invention make it possible to convert an analog signal from a transducer to a digital value with a good SN ratio without sacrificing the dynamic range.

BRIEF DESCRIPTION OF THE DRAWINGS

FIG. 3B is a circuit diagram showing a more specific exemplary configuration of the example of FIG. 3A.

FIG. 6A is a diagram showing one example of each signal waveform of the microphone signal conversion module of one embodiment of the present invention.

EMBODIMENT FOR CARRYING OUT THE INVENTION

With reference to the drawings, embodiments of a microphone signal conversion module and a microphone module of the present invention will be described. Besides, the embodiments to be described below merely show some of the forms that the microphone signal conversion module and the microphone module of the present invention can adopt. The microphone signal conversion module and the microphone module of the present invention are not limited to the embodiments to be described below.

<Overall Configuration and Operation>

Figure 1:
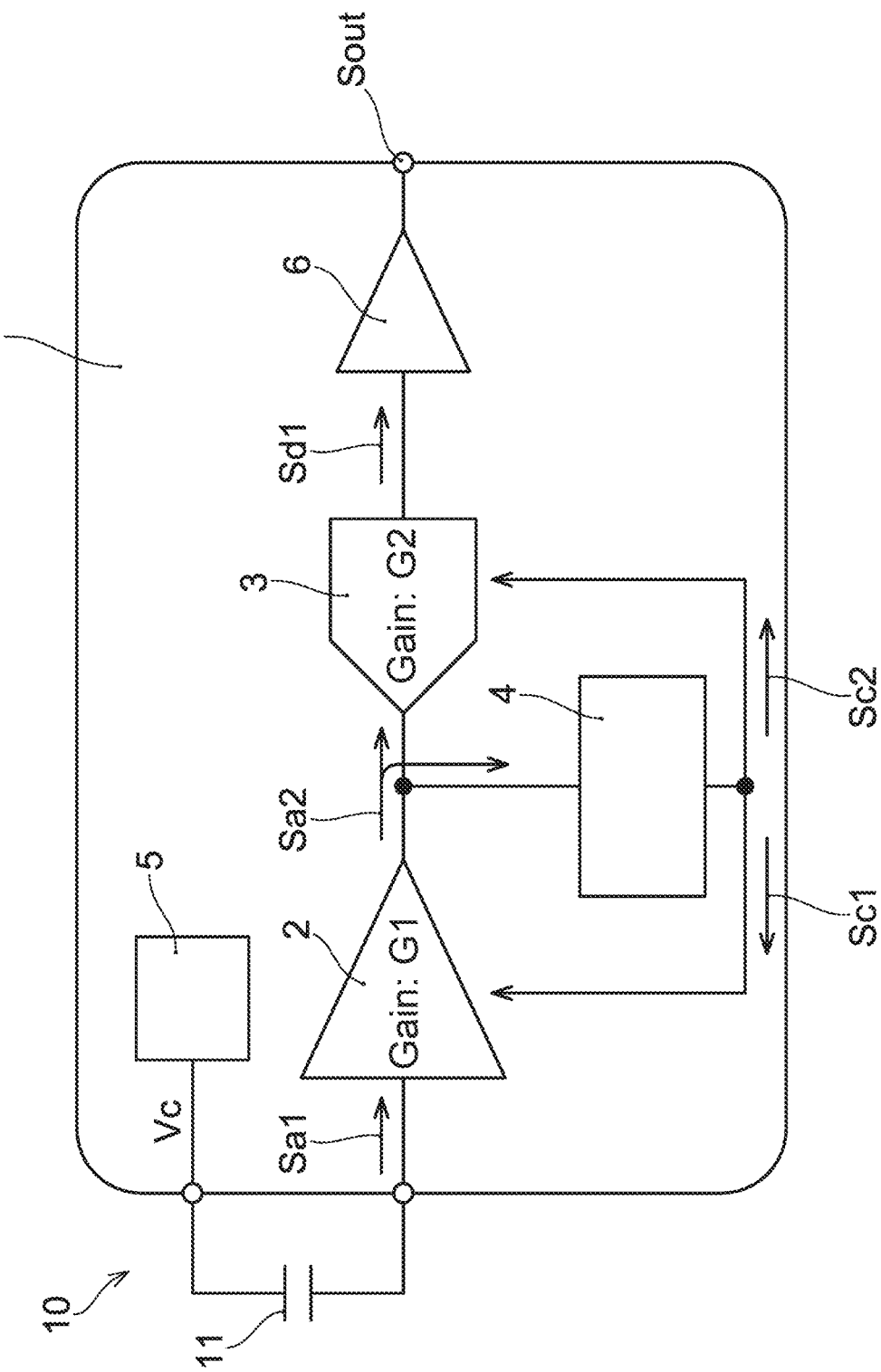
FIG. 1 is a block diagram schematically showing one example of a microphone signal conversion module and a microphone module of one embodiment of the present invention.

FIG. 1 shows a microphone signal conversion module 1 being one example of a microphone signal conversion module of one embodiment, and a microphone module 10 comprising the microphone signal conversion module 1, which microphone module 10 is one example of a microphone module of one embodiment. Besides, the microphone signal conversion module of the embodiment to be described below is also called merely "a microphone signal module".

As shown in FIG. 1, the microphone signal module 1 of the present embodiment comprises a buffer circuit 2 to carry out a level conversion of an analog signal to output the converted result; an analog-to-digital conversion circuit (an AD conversion circuit) 3 to convert the level of the analog signal to a digital value; and a control circuit 4. Moreover, the microphone module 10 of the embodiment in the example of FIG. 1 comprises the microphone signal module 1 and a microphone 11.

The microphone signal module 1 of FIG. 1 further comprises a fixed voltage source 5 and an output buffer 6. The fixed voltage source 5 generates a fixed voltage Vc as a bias voltage to operate the microphone 11 and provides the generated fixed voltage Vc to the microphone 11. The fixed voltage source is constituted by, as one example, a linear regulator such as a low dropout (LDO) regulator and the like, a switching regulator, and the like. A digital signal Sd1 is input to the output buffer 6 from the AD conversion circuit 3. The output buffer 6 outputs the digital signal Sd1 with the output impedance and drive capability required for an external device (not shown) connected to an output terminal Sout of the microphone signal module 1. The output buffer 6 is constituted by, for example, a non-inverting inverter or a complex circuit of transistors.

The buffer circuit 2 carries out a level conversion with a first gain G1 on a first analog signal Sa1 input from the microphone 11 and outputs a second analog signal Sa2 obtained by the level conversion. The AD conversion circuit 3 converts the level of the second analog signal Sa2 with a second gain G2 to a digital value and outputs the digital signal Sd1 that is a signal after the conversion. The second analog signal Sa2 is input to the control circuit 4 from the buffer circuit 2. The control circuit 4 controls the first gain G1 of the buffer circuit 2 and the second gain G2 of the AD conversion circuit 3 by outputting control signals Sc1 and Sc2 based on the level of the second analog signal Sa2. In other words, the buffer circuit 2 is configured such that control, in other words, adjustment of the first gain G1 is possible from the outside of the buffer circuit 2. In addition, the AD conversion circuit 3 is configured such that control, in other words, adjustment of the second gain G2 is possible from the outside of the AD conversion circuit 3.

Besides, as commonly used, the first gain G1 of the buffer circuit 2 is the ratio, to the level (absolute value) of an input signal, of the level (absolute value) of an output signal being output based on the input signal. On the other hand, the second gain G2 of the AD conversion circuit 3 indicates the amount of change of the digital value of an output which amount of change applies to the amount of unit change of the level of the analog signal input. For example, in a case that the second gain G2 is 0 dB, by converting an output signal of the AD conversion circuit 3 to an analog signal, an analog signal having a voltage amplitude of one times the voltage amplitude of the analog signal input to the AD conversion circuit 3 is obtained. In another example, in a case that the second gain G2 is 20 dB, an analog signal having a voltage amplitude of ten times the voltage amplitude of the input analog signal is obtained by similarly converting the output signal of the AD conversion circuit 3 to the analog signal.

The control circuit 4 is specifically configured to control the magnitude of each of the first gain G1 and the second gain G2 in mutually opposite directions based on the level of the second analog signal Sa2. In other words, based on the level of the second analog signal Sa2, the control circuit 4 decreases the second gain G2 when increasing the first gain G1 and, on the other hand, increases the second gain G2 when decreasing the first gain G1. The first gain G1 and the second gain G2 can be controlled in this way to keep constant the linearity of an output signal with respect to an input signal of the microphone signal module 1.

In the microphone signal module 1 of an embodiment comprising the control circuit 4 configured in this way, as one example, the first gain G1 in a default state (a basic state, an initial state, or a factory shipment state) is set to a relatively large value. In this way, even when the amplitude of an input signal (the first analog signal Sa1) is small, it is possible to make the amplitude of the second analog signal Sa2 large. Therefore, the SN ratio can be increased. Besides, the second gain G2 is set to a relatively small value according to the relatively large first gain G1. Therefore, as an output of the AD conversion circuit 3, the digital signal Sd1 with the magnitude corresponding to the level of the first analog signal Sa1 is obtained.

On the other hand, in a case that the amplitude of the first analog signal Sa1 is no less than a certain level, accordingly, causing signal saturation in the microphone signal module 1, the first gain G1 is decreased and the amplitude of the second analog signal Sa2 is decreased (compressed) by the control circuit 4. In this way, signal saturation in the microphone signal module 1 can be prevented. Therefore, a decrease in the dynamic range can be avoided.

Then, the control circuit 4 increases the second gain G2 when decreasing the first gain G1 in this way. In other words, a signal is expanded in a conversion from the second analog signal Sa2 to the digital signal Sd1. Accordingly, attenuation of an output signal (the digital signal Sd1) due to the decrease in the first gain G1 can be compensated for. Therefore, an output signal (the digital signal Sd1) that can reproduce, with fidelity, a relatively large amplitude of an input signal (the first analog signal Sa1) can be obtained. In other words, a decrease in the dynamic range can be prevented, or at least suppressed.

Moreover, the gain (sensitivity) of the overall microphone signal module 1 can be kept constant from a small amplitude to a large amplitude of an input signal. Even more, a good SN ratio can be ensured even when the amplitude of an input signal is small. Therefore, according to the present embodiment, an analog signal from a transducer such as the microphone 1 can be converted to a digital value with a good SN ratio without sacrificing the dynamic range.

Besides, the microphone signal module 1 of the present embodiment can receive an input signal (the first analog signal Sa1) from a transducer of, not limited to the microphone 11, but an arbitrary method and structure that can convert sound to an electrical signal. In other words, the transducer to input an input signal to the microphone signal module 1 does not have to be intended for use as a microphone. The microphone signal module 1 can receive, as the first analog signal Sa1, a signal from an arbitrary transducer that can convert air vibrations at an arbitrary frequency, not only in the audible range, to an electrical signal.

In particular, a signal generated by a MEMS transducer using MEMS technology as a mechanism for detecting air vibrations can be input to the microphone signal module 1 as the first analog signal Sa1. Therefore, the microphone 11 in the example in FIG. 1 can be a MEMS microphone. Similarly, the microphone module 10 of the embodiment can comprise the microphone signal module 1 and a MEMS transducer to generate the first analog signal Sa1. The microphone 11 included by the microphone module 10 in the example of FIG. 1 can be a MEMS microphone. It is considered that, by comprising the MEMS microphone, the microphone module 10 having, for example, small size, and good performance such as high heat resistance, and the like is obtained.

One example of each of, and variations of a part of the buffer circuit 2, the control circuit 4, and the AD conversion circuit 3 will be described below. Besides, the configuration of each circuit to be described below shows a mere example of each circuit, so that the configuration of each circuit is not limited to the configuration to be described below.

<One Example of Buffer Circuit (Inverting)>

Figure 2A:
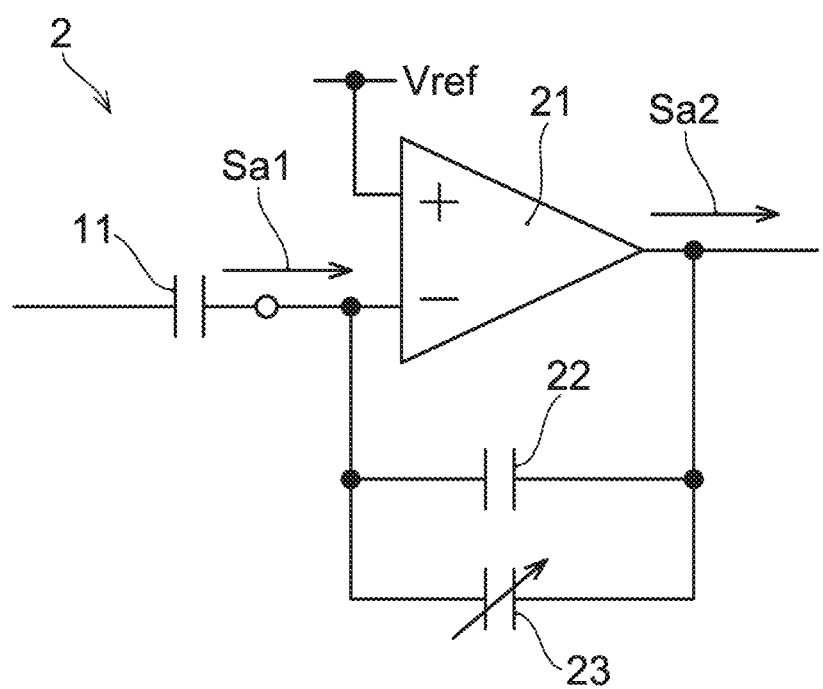
FIG. 2A is a circuit diagram showing one example of a buffer circuit of one embodiment of the present invention.

FIG. 2A shows one example of a configuration that can be adopted by the buffer circuit 2 of the microphone signal module of the present embodiment. As shown in FIG. 2A, the buffer circuit 2 comprises an operational amplifier 21 and a plurality of capacitors (a capacitor 22 and a capacitor 23). The operational amplifier 21 has an inverting input terminal to receive the first analog signal Sa1 from a transducer such as the microphone 11 and a non-inverting input terminal to which a reference potential Vref is applied. The capacitor 22 and the capacitor 23 are arranged mutually in parallel between an output terminal and the inverting input terminal of the operational amplifier 21. In FIG. 2A, the capacitance of the capacitor 22 is fixed, and, on the other hand, the capacitor 23 is a variable capacitance capacitor, the adjustment of which capacitance is possible.

The reference potential Vref is generated independently of the fixed voltage Vc by a voltage source (not shown) different from the fixed voltage source 5 in FIG. 1, for example. The reference potential Vref can be the midpoint potential of the maximum amplitude of the first analog signal Sa1 or the midpoint potential between positive and negative power sources (between a power source and the ground in a case of a single power source) for the operational amplifier 21, for example.

The microphone 11 has an inherent capacitance in a case of a capacitive transducer such as a capacitive MEMS microphone. Therefore, the first gain G1 of the buffer circuit 2 to the AC component of the first analog signal Sa1 is expressed by the following (Equation 1):

$$G1 = C11/(C22+C23) \quad \text{(Equation 1)}$$

Here, C11, C22, and C23 are the capacitances of the microphone 11, the capacitor 22, and the capacitor 23, respectively. Therefore, the control circuit 4 (see FIG. 1) can adjust the first gain G1 by adjusting the capacitance of the capacitor 23.

Figure 2B:
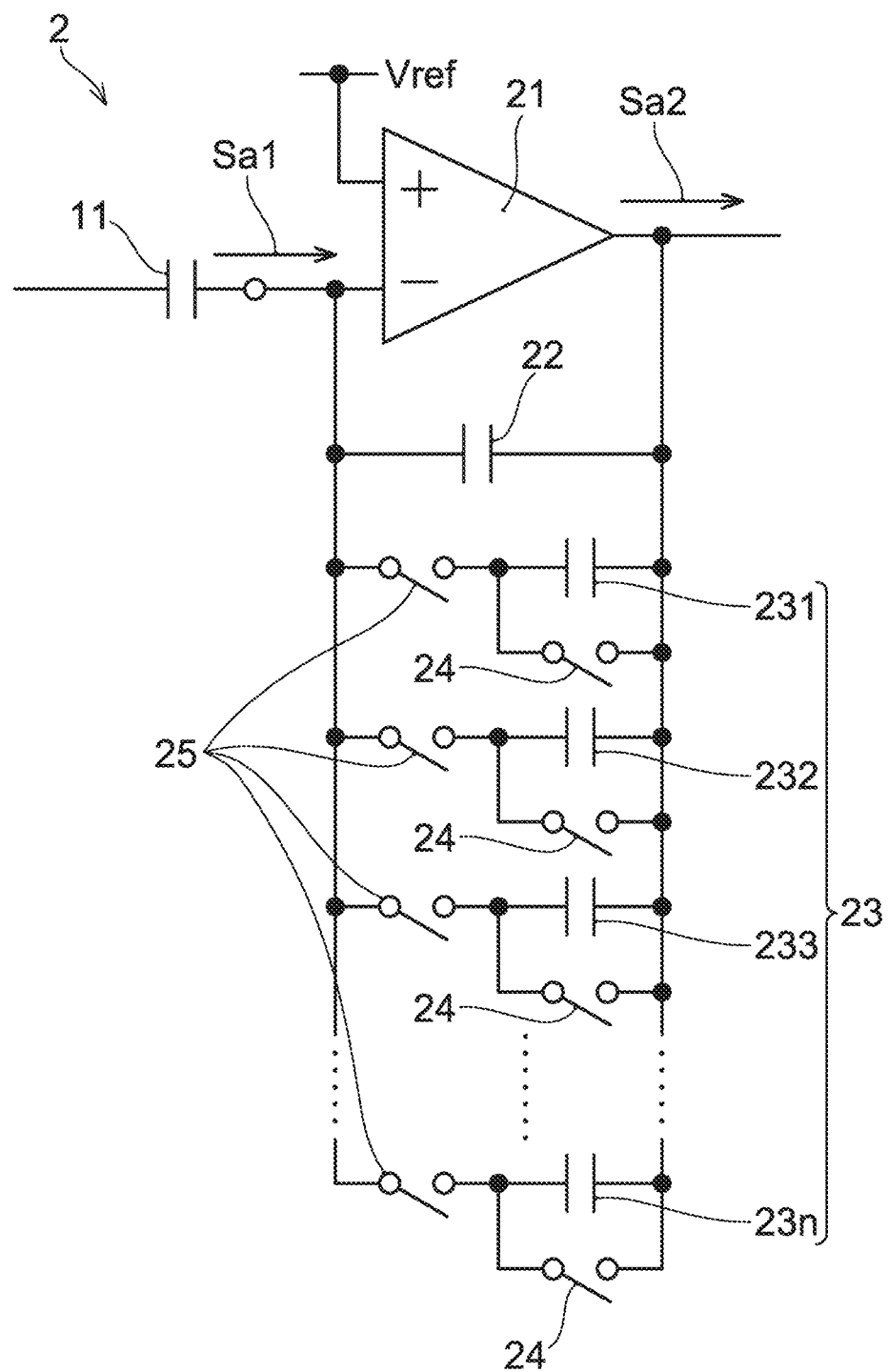
FIG. 2B is a circuit diagram showing a more specific exemplary configuration of the example of FIG. 2A.

FIG. 2B shows a more specific exemplary configuration of one example of the buffer circuit 2 of FIG. 2A. FIG. 2B shows, in a more specified manner, the capacitor 23, the adjustment of which capacitance is possible. As shown in FIG. 2B, the capacitor 23 is constituted by a plurality of capacitors for adjustment of the first gain G1, capacitors 231, 232, 233, . . . up to 23n. In this way, the buffer circuit 2 comprises a plurality of capacitors arranged between the output terminal and the inverting input terminal of the operational amplifier 21.

Moreover, the buffer circuit 2 comprises a plurality of switches 24 and a plurality of switches 25. Each of the switches 25 is arranged between one end of any one of the capacitors 231 to 23n being a part of a plurality of capacitors between an output terminal and an inverting input terminal of the operational amplifier 21, and the inverting input terminal of the operational amplifier 21. Each of the switches 25 connects or separates any one of the capacitors 231 to 23n, to which each of the switches 25 is connected, and the inverting input terminal of the operational amplifier 21. On the other hand, each of the switches 24 is connected in parallel with any one of the capacitors 231 to 23n. When each of the switches 24 closes, a capacitor connected in parallel with the closed switch 24, among the capacitors 231 to 23n, discharges.

In the buffer circuit 2 being configured as in FIG. 2B, by closing a desired number of switches 25, it is possible to adjust the combined capacitance of the capacitor 22 and the capacitor 23. In other words, the first gain G1 can be adjusted. According to (Equation 1) above, by closing the switch 25, it is possible to increase the capacitances 231 to 23n connected to the operational amplifier 21 via the switch 25 and to decrease the first gain G1. Therefore, the control circuit 4 can be configured to control the first gain G1 by opening/closing the switch 25. In a case that the amplitude of the first analog signal Sa1 is large, for example, the control circuit 4 (see FIG. 1) can attenuate the second analog signal Sa2 by closing the switch 25.

Moreover, in the example of FIG. 2B, by closing the switch 24, it is possible to discharge capacitors not contributing to the adjustment of the first gain G1, in other words, not connected to the operational amplifier 21 via the switch 25, among the capacitors 231 to 23n. The control circuit 4 is configured to discharge capacitors by closing the switch 24, which are not contributing to the setting of the first gain G1, among the individual capacitors constituting the capacitor 23.

As described above, the capacitors 231 to 23n are preferably configured to discharge when they are separated from the inverting input terminal of the operational amplifier 21 by the switch 25. By discharging the capacitors 231 to 23n in this way, the amount of charge stored between the input and output terminals of the operational amplifier 21 is correctly maintained when these separated capacitors are connected to the operational amplifier 21 to change the first gain G1. Accordingly, theoretically, no DC offset of the second analog signal Sa2 due to changing of the first gain G1 is produced. Therefore, the first gain G1 can be changed even not at the time of zero crossing (or at the time of midpoint potential crossing) of the first analog signal Sa1.

As described previously, when the second analog signal Sa2 is attenuated, the switch 25 is closed. On the other hand, all the switches 25 being open and all the switches 24 being closed can be the default state of the microphone signal module. With all the switches 25 being open in this way, as evident from (Equation 1) above, the first gain G1 is determined by the ratio of the capacitance of the capacitor 22 and the capacitance of the microphone 11. Not only in this default state, the first gain G1 depends on the capacitance of the transducer such as the microphone 11 as shown in (Equation 1).

However, the amount of change in the first gain G1 by closing the switch 25 (for example, the attenuation amount of the second analog signal Sa2 by closing the one switch 25) is determined by the ratio of C22 and C23 in the denominator of (Equation 1) above. In other words, the attenuation rate of the first gain G1 by adjustment of the capacitance of the capacitor 23 is expressed by (Equation 2) in the following:

$$\partial G1 = 1 + (C22/C23) \quad \text{(Equation 2)}$$

As one example, in a case that the microphone signal module of the embodiment is formed on a semiconductor substrate, the capacitor 22 and the capacitor 23 are formed on the semiconductor substrate. In such a case, accurately creating the ratio between the capacitance of the capacitor 22 and the capacitance of each of the capacitors 231 to 23n is relatively easy. Accordingly, correctly configuring the amount of change of the first gain G1 by closing the switch 25 can be relatively easy.

Therefore, by configuring the element determining the second gain G2 also on a semiconductor substrate in the same manner as the capacitors 22 and 23, a good linearity of the microphone signal module can be easily ensured even when the capacitance of the microphone 11 varies. In this way, with the inverting buffer circuit 2 exemplified in FIGS. 2A and 2B, the first gain G1 depends on the variation in the capacitance of the transducer such as the microphone 11. However, it is considered that ensuring the linearity in the signal conversion of the microphone signal module involving the control of each gain is relatively easy. Besides, the fluctuation of the first gain G1 due to the variation in the capacitance of the transducer can be compensated for using a conventionally carried out adjustment method.

<Another Example of Buffer Circuit (Non-Inverting)>

Figure 3A:
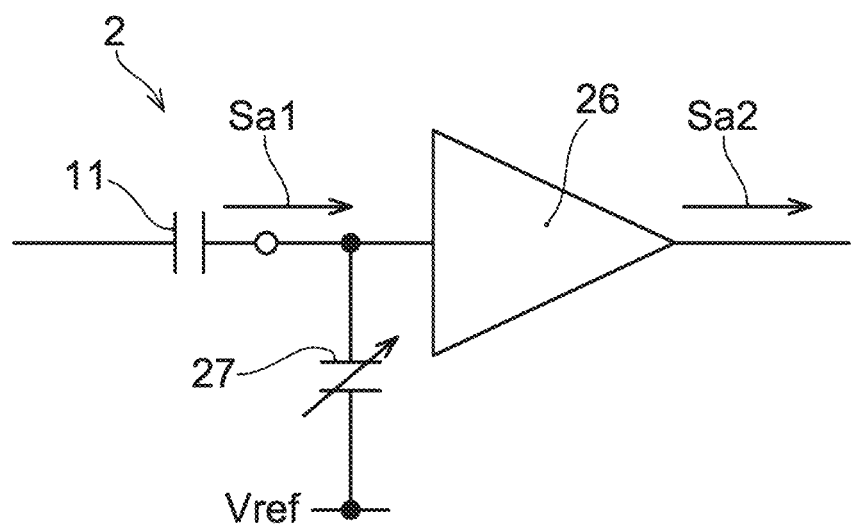
FIG. 3A is a circuit diagram showing another example of the buffer circuit of one embodiment of the present invention.

FIG. 3A shows another example of the configuration that can be adopted by the buffer circuit 2 of the microphone signal module of the present embodiment. In the example shown in FIG. 3A, the buffer circuit 2 comprises a non-inverting buffer 26 and a capacitor 27. The non-inverting buffer 26 has an input terminal to receive the first analog signal Sa1 sent from the microphone 11. As one example, the non-inverting buffer 26 is an operational amplifier in which an inverting input terminal and an output terminal are connected so as to configure a voltage follower. A non-inverting input terminal of the operational amplifier can be an input terminal of the non-inverting buffer 26 of FIG. 3A. In the example of FIG. 3A, the microphone 11 is a capacitive transducer such as a capacitive MEMS microphone. The capacitor 27 is arranged between the input terminal of the non-inverting buffer 26 and the reference potential Vref being a predetermined fixed potential. The capacitor 27 is a variable capacitance capacitor, the adjustment of which capacitance is possible.

The reference potential Vref is generated independently of the fixed voltage Vc by a voltage source (not shown) different from the fixed voltage source 5 in FIG. 1, for example. The reference potential Vref can be the midpoint potential of the maximum amplitude of the first analog signal Sa1 or the midpoint potential between positive and negative power sources (between a power source and the ground in a case of a single power source) for the operational amplifier 21, for example.

The microphone 11 being a capacitive transducer has an inherent capacitance. Therefore, the first gain G1 of the buffer circuit 2 to the AC component of the first analog signal Sa1 is expressed by the following (Equation 3):

$$G1 = C11/(C11 + C27) \quad \text{(Equation 3)}$$

Here, C11 and C27 are the capacitances of the microphone 11 and the capacitor 27, respectively. Therefore, the control circuit 4 (see FIG. 1) can adjust the first gain G1 by adjusting the capacitance of the capacitor 27.

FIG. 3B shows a more specific exemplary configuration of one example of the buffer circuit 2 of FIG. 3A. FIG. 3B shows, in a more specified manner, the capacitor 27, the adjustment of which capacitance is possible. As shown in FIG. 3B, the capacitor 27 is constituted by a plurality of capacitors for adjustment of the first gain G1, capacitors 271, 272, 273, . . . up to 27n. In other words, the buffer circuit 2 comprises a plurality of capacitors, each of which is arranged between the input terminal of the non-inverting buffer 26 and the reference potential Vref being a predetermined fixed potential.

Moreover, the buffer circuit 2 comprises a plurality of switches 28 and a plurality of switches 29. Each of the switches 29 is arranged between the input terminal of the non-inverting buffer 26, and one end of any one of the capacitors 271 to 27n. The switch 29 connects or separates the plurality of capacitors 271 to 27n, and the input terminal of the non-inverting buffer 26. On the other hand, each of the switches 28 is connected in parallel with any one of the capacitors 271 to 27n. When each of the switches 28 closes, a capacitor connected in parallel with the closed switch 28, among the capacitors 271 to 27n, discharges.

In the buffer circuit 2 being configured as in FIG. 3B, by closing a desired number of switches 29, it is possible to adjust the first gain G1 by adjusting the capacitance of the capacitor 27. According to (Equation 3) above, by closing the switch 29, it is possible to decrease the first gain G1 by increasing the capacitances 271 to 27n connected to the non-inverting buffer 26. Therefore, the control circuit 4 can be configured to control the first gain G1 by opening/closing the switch 29. In a case that the amplitude of the first analog signal Sa1 is large, for example, the control circuit 4 (see FIG. 1) can attenuate the second analog signal Sa2 by closing the switch 29.

Moreover, in the example of FIG. 3B, by closing the switch 28, it is possible to discharge capacitors not connected to the non-inverting buffer 26 via the switch 29, among the capacitors 271 to 27n. The control circuit 4 is configured to discharge capacitors by closing the switch 28, which capacitors do not contribute to the setting of the first gain G1, among the respective capacitors constituting the capacitor 27.

The capacitors 271 to 27n are preferably configured to discharge when they are separated from the input terminal of the non-inverting buffer 26 by the switch 29 as described above. By discharging the capacitors 271 to 27n in this way, when these separated capacitors are connected to the non-inverting buffer 26 to change the first gain G1, the amount of charge stored in the capacitors connected to the non-inverting buffer 26 is correctly maintained. Accordingly, theoretically, no DC offset of the second analog signal Sa2 due to changing of the first gain G1 is produced. Therefore, the first gain G1 can be changed even not at the time of zero crossing (or at the time of midpoint potential crossing) of the first analog signal Sa1.

As described previously, when the second analog signal Sa2 is attenuated, the switch 29 is closed. On the other hand, all the switches 29 being open and all the switches 28 being closed can be the default state of the microphone signal module. With all the switches 29 being open, as evident from (Equation 3) above, the first gain G1 is one times (0 DB). Therefore, it is considered that, in the example of FIG. 3B, the variation in the first gain G1 in the default state is small.

On the other hand, the amount of change in the first gain G1 by closing the switch 29 (for example, the attenuation amount of the second analog signal Sa2 by closing the one switch 29) is determined by the ratio of C11 and C27 in the denominator of (Equation 3) above. In other words, the attenuation rate of the first gain G1 ($\partial G1$) by adjustment of the capacitance of the capacitor 27 is expressed by (Equation 4) in the following:

$$\partial G1 = 1 + (C11/C27) \quad \text{(Equation 4)}$$

Therefore, the amount of change in the first gain G1 depends on the variation in the capacitance C11 of the capacitive transducer.

The capacitance C11 varies independently of the capacitance C27 of the capacitor 27, so that the amount of change in the first gain G1 with respect to the adjustment amount of the capacitance C27 varies in accordance with the variation in the capacitance C11. Therefore, in such an operation region that any one of the switches 29 is closed to attenuate the second analog signal Sa2, a linearity between an input of the buffer circuit 2 and an output of the AD conversion circuit 3 (see FIG. 1) is not maintained depending on the variation in the capacitance of the transducer. For example, in a plot diagram in which these inputs and outputs are taken on the horizontal and vertical axes, the relationship between them is shown with a straight line in a region of small input values, but in a region of input values not less than a certain value, it is shown with a curve whose slope gradually increases or decreases. Then, to compensate for this variation in the capacitance of the transducer, adjustment of the feedback amount in the AD conversion circuit 3 (see FIG. 1) is preferably carried out. This adjustment will be described in detail later with reference to FIG. 7.

The capacitors 231 to 23n in FIG. 2B and the capacitors 271 to 27n in FIG. 3B are arranged in numbers corresponding to the number of setting values required for the first gain G1. Then, each of the switches 24 and the switches 25 is provided in the same number as the number of capacitors 231 to 23n. Similarly, each of the switches 28 and the switches 29 is provided in the same number as the number of capacitors 271 to 27n. By providing the n capacitors 231 to 23n or n capacitors 271 to 27n, it is possible to set the first gain G1 to n values other than a value in the default state.

<Control Circuit>

Figure 4:
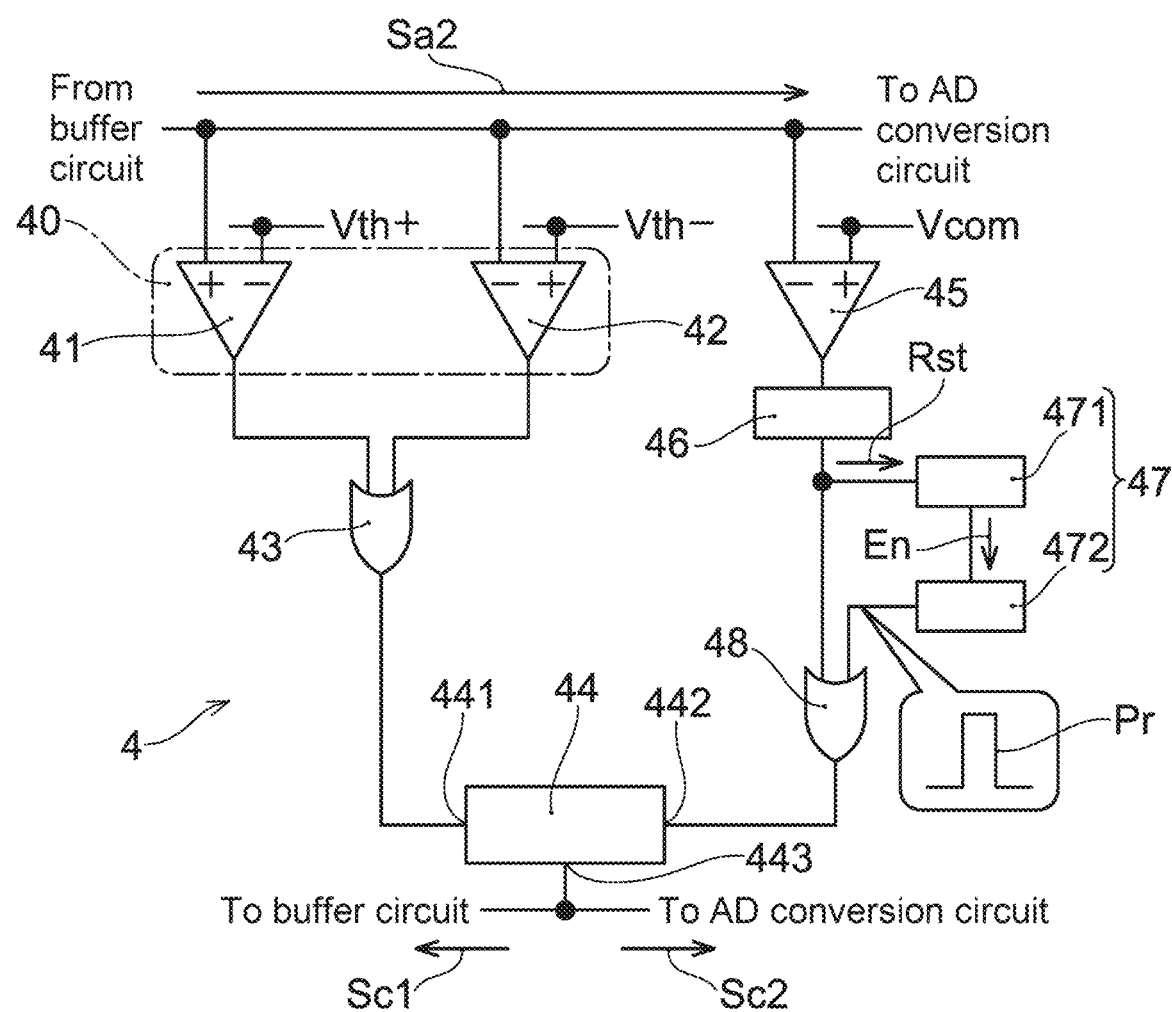
FIG. 4 is a block diagram showing one example of a control circuit of one embodiment of the present invention.

FIG. 4 shows, in a block diagram, one example of a configuration that can be adopted by the control circuit 4 of the microphone signal module of the present embodiment. The control circuit 4 exemplified in FIG. 4 comprises a comparison circuit 40, an OR gate 43, a counter 44, a detector 45, an edge detection circuit 46, a pulse generation circuit 47, and an OR gate 48. The pulse generation circuit 47 comprises a timer 471 and a pulse generator 472. The comparison circuit 40 compares the level of the second analog signal Sa2 with a predetermined upper limit threshold Vth+ and a predetermined lower limit threshold Vth−. In the example of FIG. 4, the comparison circuit 40 comprises a comparator 41 and a comparator 42.

The upper limit threshold Vth+ is input to the inverting input terminal of the comparator 41, and the lower limit threshold Vth− is input to the non-inverting input terminal of the comparator 42. The non-inverting input terminal of the comparator 41 and the inverting input terminal of the comparator 42 are connected to the output terminal of the buffer circuit 2 (see FIG. 1). Therefore, the second analog signal Sa2 is input to the non-inverting input terminal of the comparator 41 and the inverting input terminal of the comparator 42. The comparator 41 compares the predetermined upper limit threshold Vth+ and the second analog signal Sa2. The comparator 42 compares the predetermined lower limit threshold Vth− and the second analog signal Sa2. The output voltage of each of the comparator 41 and the comparator 42 is input to each input terminal of the OR gate 43. The comparator 41 and the comparator 42 constitute a wind comparator having a range from the lower limit threshold Vth− to the upper limit threshold Vth+ as the comparison target.

The counter 44 comprises an increment input terminal 441, a decrement terminal 442, and an output terminal 443. The counter 44 increments the count value by 1 according to an input of either a rising edge or a falling edge to the increment input terminal, and decrements the count value by 1 according to an input of either a rising edge or a falling edge to the decrement input terminal. The counter 44 outputs the internally-held count value serially or parallelly from one or a plurality of output terminals 443.

From the OR gate 43, the logical sum of the logical value of the output voltage of the comparator 41 and the logical value of the output voltage of the comparator 42 is output to the increment input terminal 441 of the counter 44. Therefore, the count value of the counter 44 is incremented each time the second analog signal Sa2 exceeds the upper limit threshold Vth+ and is incremented each time the second analog signal Sa2 falls below the lower limit threshold Vth−.

The detector 45 is constituted by a comparator. The inverting input terminal of the detector 45 is connected to the output terminal of the buffer circuit 2. The second analog signal Sa2 is input to the inverting input terminal of the detector 45, and a midpoint potential Vcom of the maximum amplitude of the second analog signal Sa2 is input to the non-inverting input terminal thereof. Therefore, the detector 45 detects the inversion of the magnitude relationship between the level of the second analog signal Sa2 and the midpoint potential Vcom (the intersection of the second analog signal Sa2 and the midpoint potential Vcom on the time series, which intersection is a zero crossing in a case that the midpoint potential Vcom is 0 V). Each time the inversion is detected, the logic of the output voltage of the detector 45 changes from "positive ("1")" (high level potential) to "negative ("0")" (low level potential), or from "negative" to "positive".

Specifically, in the example of FIG. 4, when the level of the second analog signal Sa2 reaches the midpoint potential Vcom from the side lower than the midpoint potential Vcom or exceeds the midpoint potential Vcom, the logic of the output voltage of the detector 45 changes from "positive" to "negative". On the other hand, when the level of the second analog signal Sa2 reaches the midpoint potential Vcom from the side higher than the midpoint potential Vcom or falls below the midpoint potential Vcom, the logic of the output voltage of the detector 45 changes from "negative" to "positive". Besides, unlike FIG. 4, the second analog signal Sa2 can be input to the non-inverting input terminal of the detector 45, and the midpoint potential Vcom can be input to the inverting input terminal thereof.

The edge detection circuit 46 detects the rising edge of the output voltage of the detector 45 and detects the falling edge of the output voltage of the detector 45. The edge detection circuit 46 outputs a pulse to the OR gate 48 each time either of both of these edges is detected. The output terminal of the edge detection circuit 46 is connected to one of the two input terminals of the OR gate 48, and the output terminal of the pulse generator 472 is connected to the other of the two input terminals. The output terminal of the OR gate 48 is connected to the decrement input terminal 442 of the counter 44. In the OR gate 48, with the low level being input from the pulse generator 472, each time a pulse is input from the edge detection circuit 46, a pulse being substantially the same as that input pulse is output to the decrement input terminal 442 of the counter 44. Therefore, the count value of the counter 44 is decremented each time an inversion of the magnitude relationship between the level of the second analog signal Sa2 and the midpoint potential Vcom is detected.

In other words, the counter 44 is incremented when the comparison circuit 40 detects that the level of the second analog signal Sa2 is outside the range from the lower limit threshold Vth− to the upper limit threshold Vth+, and is decremented when the detector 45 detects an inversion of the magnitude relationship between the level of the second analog signal Sa2 and the midpoint potential Vcom. As one example, the upper limit threshold Vth+ and the lower limit threshold Vth− are selected in accordance with the maximum value and the minimum value, respectively, of the maximum input voltage range of the AD conversion circuit 3. As one example, the upper limit threshold Vth+ is a voltage value being lower than the maximum value of the maximum input voltage range of the AD conversion circuit 3 by a predetermined voltage width. Similarly, the lower limit threshold Vth− can be a voltage value being higher than the minimum value of the maximum input voltage range of the AD conversion circuit 3 by a predetermined voltage width.

As the count value is increased/decreased as described above, the count value of the counter 44 gradually increases when the level of the second analog signal Sa2, as one example, continues to approach the maximum value or the minimum value of the maximum input voltage range of the AD conversion circuit 3 or to exceed the maximum input voltage range thereof. On the other hand, the count value of the counter 44 gradually decreases when the level of the second analog signal Sa2 repeatedly crosses the midpoint potential Vcom without reaching a value in the neighborhood of the maximum value or the minimum value of the maximum input voltage range of the AD conversion circuit 3.

Therefore, by adjusting the first gain G1 in accordance with the count value of the counter 44, it is possible to suppress generation of such a second analog signal Sa2 as to exceed the maximum input voltage range of the AD conversion circuit 3, for example. In other words, signal saturation in the microphone signal module can be prevented. Moreover, by adjusting the second gain G2 in accordance with the count value of the counter 44 in the same manner as the first gain G1, it is possible to compensate for attenuation of the output signal of the AD conversion circuit 3 (see FIG. 1) due to decreasing the first gain G1. Therefore, the control circuit 4 configured as in the example of FIG. 4 can be configured to control the first gain G1 and the second gain G2 in accordance with the count value of the counter 44.

The count value output serially or parallelly from the output terminal 443 of the counter 44 can be output to the buffer circuit 2 as the control signal Sc1 to control the first gain G1 or can be output to the AD conversion circuit 3 as the control signal Sc2 to control the second gain G2. Alternatively, the control circuit 4 can carry out required signal processing such as processing, distribution, and the like on an output signal from the counter 44, which output signal includes information on the count value, using an appropriate signal processing circuit (not shown). Then, the control circuit 4 can output the signal processed to each of the buffer circuit 2 and the AD conversion circuit 3 as the control signals Sc1 and Sc2.

In the control circuit 4 of the example of FIG. 4, when the inversion of the magnitude relationship between the level of the second analog signal Sa2 and the midpoint potential Vcom is detected, a reset signal Rst is input to the timer 471 from the edge detection circuit 46. Each time the reset signal Rst is input, the timer 471 resets the timekeeping state up to that time and measure the elapsed time thereafter. Then, when a predetermined time preset elapses, the timer 471 outputs an enable signal En to the pulse generator 472, resets the internal timekeeping state, and repeats the timekeeping. When the enable signal En is input, the pulse generator 472 outputs a pulse Pr for each predetermined time preset.

In this way, when the predetermined time has elapsed between the detection of the inversion and the detection of the following inversion of the magnitude relationship between the level of the second analog signal Sa2 and the midpoint potential Vcom by the detector 45, the pulse generation circuit 47 outputs the pulse Pr to the counter 44. Specifically, the pulse generation circuit 47 in the example of FIG. 4 outputs the pulse Pr to the OR gate 48. With the low level being input from the edge detection circuit 46, the OR gate 48 outputs the pulse Pr to the decrement input terminal 442 of the counter 44 each time the pulse Pr is input from the pulse generation circuit 47. In other words, the counter 44 is configured to decrement the count value each time the pulse Pr is output. Therefore, each time a predetermined time being set in the timer 471 has elapsed from the time the inversion of the magnitude relationship between the level of the second analog signal Sa2 and the midpoint potential Vcom is detected to the time the following inversion thereof is detected, the count value of the counter 44 is decremented.

In the control circuit 4 of FIG. 4, which control circuit 4 comprises the pulse generation circuit 47, the count value of the counter 44 can be forcefully decremented by operating the pulse generator 472 based on the elapse of the predetermined time. With such a configuration, the count value of the counter 44 can be decremented when the second analog signal Sa2 is a small signal or no signal such that it cannot be detected by the detector 45. Alternatively, the count value of the counter 44 can be decremented when the second analog signal Sa2 of a small amplitude does not change across the midpoint potential Vcom due to a slight offset from the midpoint potential Vcom. By forcefully decrementing the count value in this way, the first gain G1 and the second gain G2 can be controlled to suitable values.

The predetermined time to be set to the timer 471 is 50 msecs or more as an example. When such a time is set to the timer 471, even when the second analog signal Sa2 is a small signal or no signal, the initial state can be restored. Besides, even in a case of the inversion of the magnitude relationship between the level of the second analog signal Sa2 and the midpoint potential Vcom when the count value is zero, the pulse Pr input to the decrement input terminal 442 of the counter 44 is ignored. Therefore, the count value does not change.

<AD Conversion Circuit>

Figure 5A:
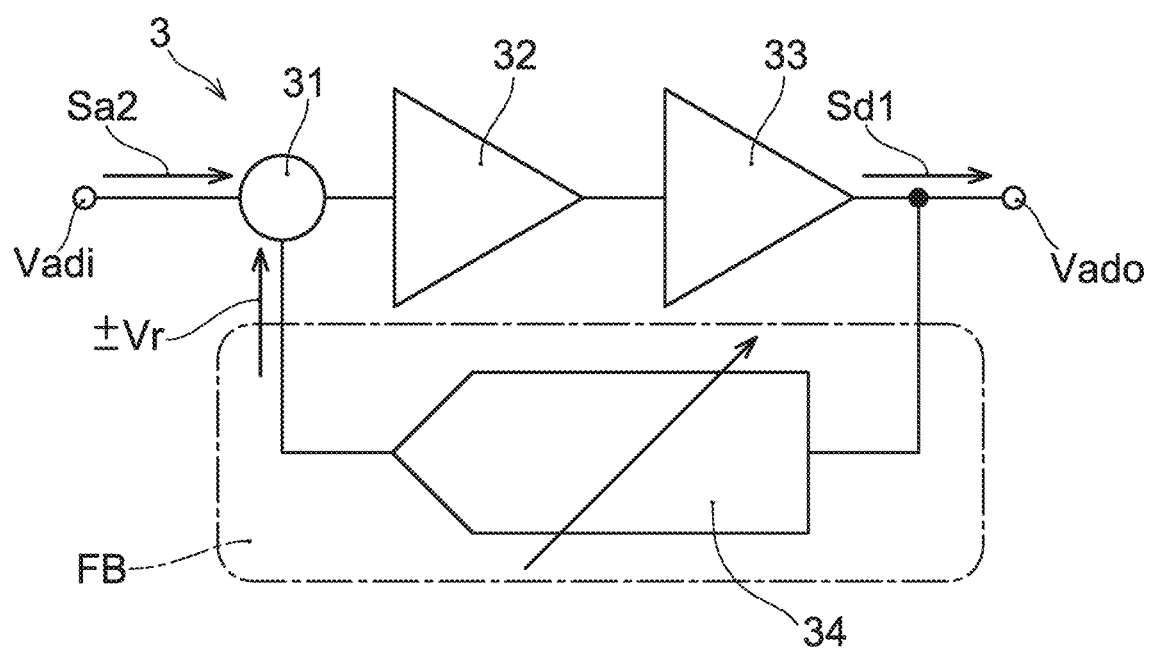
FIG. 5A is a block diagram showing one example of an AD conversion circuit of one embodiment of the present invention.

FIG. 5A shows, in a block diagram, one example of a configuration that can be adopted by the AD conversion circuit 3 of the microphone signal module of the present embodiment. The AD conversion circuit 3 exemplified in FIG. 5A is a delta-sigma type AD conversion circuit to carry out a delta-sigma modulation on an input signal (the "delta-sigma type AD conversion circuit" is also called a "sigma-delta type AD conversion circuit"). Therefore, the AD conversion circuit 3 comprises a subtractor 31, an integrator 32, a quantizer 33, and a one-bit digital-to-analog converter (DA converter) 34. A feedback circuit FB to feedback an output value of the AD conversion circuit 3 from an output terminal Vado to an input terminal Vadi of the AD conversion circuit 3 is constituted primarily by the DA converter 34.

The subtractor 31 subtracts a positive or negative reference voltage (+Vr or −Vr) output by the DA converter 34 from the second analog signal Sa2 to output the subtracted result to the integrator 32. The integrator 32 cumulatively adds the output of the subtractor 31 to output the cumulatively-added result to the quantizer 33. The quantizer 33 outputs a digital value of "positive ("1")" (high-level potential) in a case that the voltage input from the integrator 32 is no less than the reference value, and outputs a digital value of "negative ("0")" (low-level potential) in a case that it is no greater than the reference value. The DA converter 34 outputs the positive reference voltage +Vr to the subtractor 31 in a case that the output of the quantizer 33 is "positive", and outputs the negative reference voltage (−Vr) to the subtractor 31 in a case that the output of the quantizer 33 is "negative". A digital output value of a PDM (pulse density modulation) format, according to the magnitude of the second analog signal Sa, is obtained by carrying out such a delta-sigma modulation on the second analog signal Sa2. The AD conversion circuit 3 operating in this way is suitable for combining with the inverting buffer circuit 2 exemplified in FIGS. 2A and 2B.

In the AD conversion circuit 3 shown in FIG. 5A, the feedback amount of the feedback circuit FB is configured to be adjustable. The "feedback amount" means the magnitude of the voltage given to the input side of the AD conversion circuit 3 based on the output of the quantizer 33. More specifically, in the example of FIG. 5A, the "feedback amount" means the magnitude of the positive or negative reference voltage Vr input to the subtractor 31 based on each of the positive and negative outputs of the quantizer 33. When the feedback amount increases, the amount of change in the subtraction result for each subtraction process by the subtractor 31 increases, so that the digital value output from the quantizer 33 with respect to the second analog signal Sa2 input decreases and the second gain G2 decreases. Conversely, when the feedback amount decreases, the digital value output with respect to the second analog signal Sa2 input increases and the second gain G2 increases. In other words, the second gain G2 of the AD conversion circuit 3 can be controlled by increasing/decreasing the feedback amount of the feedback circuit FB. Therefore, the control circuit 4 (see FIG. 1) can be configured to control the second gain G2 by increasing/decreasing the feedback amount of the feedback circuit FB. It is considered that such a configuration makes the control of the second gain G2 easy.

Figure 5B:
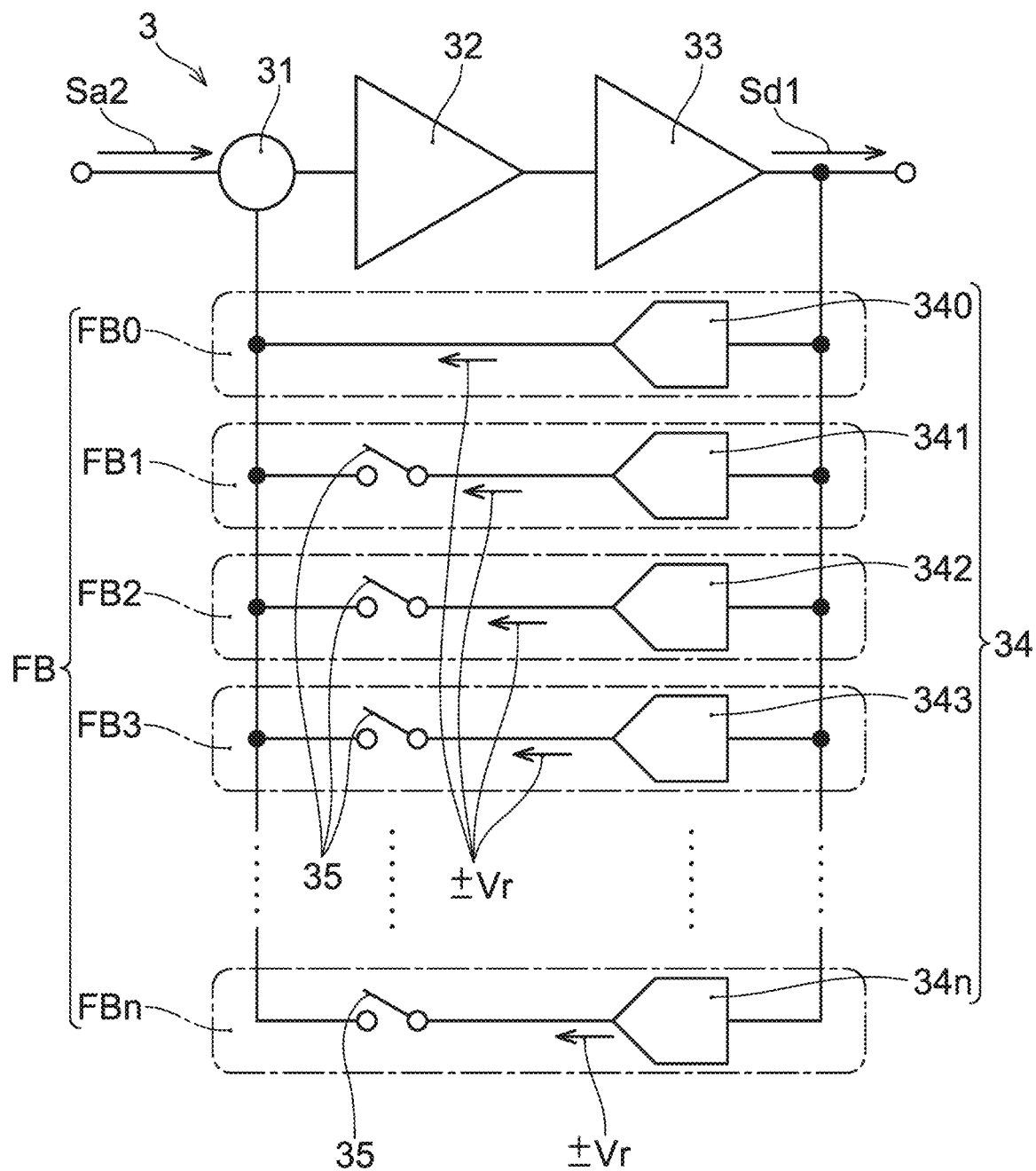
FIG. 5B is a block diagram showing a more specific exemplary configuration of the example of FIG. 5A.

FIG. 5B shows a more specific exemplary configuration of one example of the AD conversion circuit 3 of FIG. 5A. FIG. 5B shows, in a more specified manner, the feedback circuit FB, the adjustment of which feedback amount is possible. As shown in FIG. 5B, the feedback circuit FB is constituted by a plurality of feedback circuits FB0, FB1, FB2, FB3, . . . , up to FBn. The feedback circuit FB0 is constituted primarily by a DA converter 340. Similarly, the feedback circuits FB1, FB2, FB3, . . . . FBn are constituted primarily by DA converters 341, 342, 343, . . . 34$n$, respectively. In this way, the AD conversion circuit 3 can comprise a plurality of arbitrary feedback circuits, each of which is constituted by a DA converter.

Moreover, the AD conversion circuit 3 of FIG. 5B comprises a plurality of switches 35. The respective switches 35 are provided in the feedback circuits FB1 to FBn, respectively. The switches 35 are arranged between the output of the respective DA converters 341 to 34$n$ and the subtractor 31, and separate or connect the output of the respective DA converters 341 to 34$n$ and the subtractor 31.

Each of the DA converters 340, 341 to 34$n$ outputs the positive or negative reference voltage Vr in accordance with the output logic of the quantizer 33 as described previously. Accordingly, the greater the number of DA converters connected to the subtractor 31 by the switch 35, among the DA converters 340 to 34*n*, the greater the feedback amount in the overall feedback circuit FB. Conversely, the less the number of DA converters connected, the less the feedback amount. In other words, the feedback amount of the feedback circuit FB can be adjusted by controlling opening/closing of each switch 35. Therefore, the control circuit 4 (see FIG. 1) can be configured to control the second gain G2 by opening/closing the switch 35.

As an example, the state in which the switches 35 are all closed can be the default state of the microphone signal module 1. In that state, the feedback circuit FB is constituted by the DA converters 340 to 34*n*. Then, each time one of the switches 35 is opened, the feedback amount of the feedback circuit FB decreases only by the reference voltage Vr output by any one of the DA converters 341 to 34*n* connected to that opened-switch 35. The second gain G2 increases in accordance with that decrease in the feedback amount. Besides, the reference voltages Vr output by the respective DA converters 340, 341 to 34*n* can all be the same or can be different.

The feedback circuits FB1 to FBn are provided in the number corresponding to the number of setting values required for the second gain G2. Then, the respective switches 35 are provided in the same number as the number of feedback circuits FB1 to FBn. By providing the n feedback circuits FB1 to FBn, it is possible to set the second gain G2 to n values other than the value in the default state.

Preferably, the AD conversion circuit 3 is configured such that the change rate of the second gain G2 by closing one of the switches 35 is substantially the same as the change rate of the first gain G1 by closing one of the switches 25 in the buffer circuit 2 in the example of FIG. 2B. The change rate of the second gain G2 by closing one of the switches 35 can be substantially the same as the change rate of the first gain G1 by closing one of the switches 29 in the buffer circuit 2 in the example of FIG. 3B, and is preferably substantially the same. Moreover, the first gain G1 and the second gain G2 can be opposite numbers (substantially the same in absolute value with reverse positive/negative signs) of each other in decibel representation. When the AD conversion circuit 3 and the buffer circuit 2 are configured in this way, maintenance of the linearity of the microphone signal module can be easy in control of the first gain G1 and the second gain G2.

As one example, the control circuit 4 (see FIG. 1) can output a plurality of control signals including a control signal for each of the plurality of switches 24 and the plurality of switches 25 of FIG. 2B. As another example, the control circuit 4 can output a plurality of control signals including a control signal for each of the plurality of switches 28 and the plurality of switches 29 of the example of FIG. 3B. Moreover, the control circuit 4 can output a plurality of control signals including a control signal for each of the plurality of switches of the example of FIG. 5B. Then, each of the plurality of control signals can be, in each of the switches 24 and 25, 28 and 29, or 35, input to a control terminal to control opening/closing thereof. Alternatively, a control signal output from the control circuit 4 can be distributed, via a suitable multiplexer (not shown), to the control terminal of each switch 24 and each switch 25, or each switch 28 and each switch 29, and distributed to the control terminal of each switch 35.

<Exemplary Waveform of Each Signal>

Figure 6B:
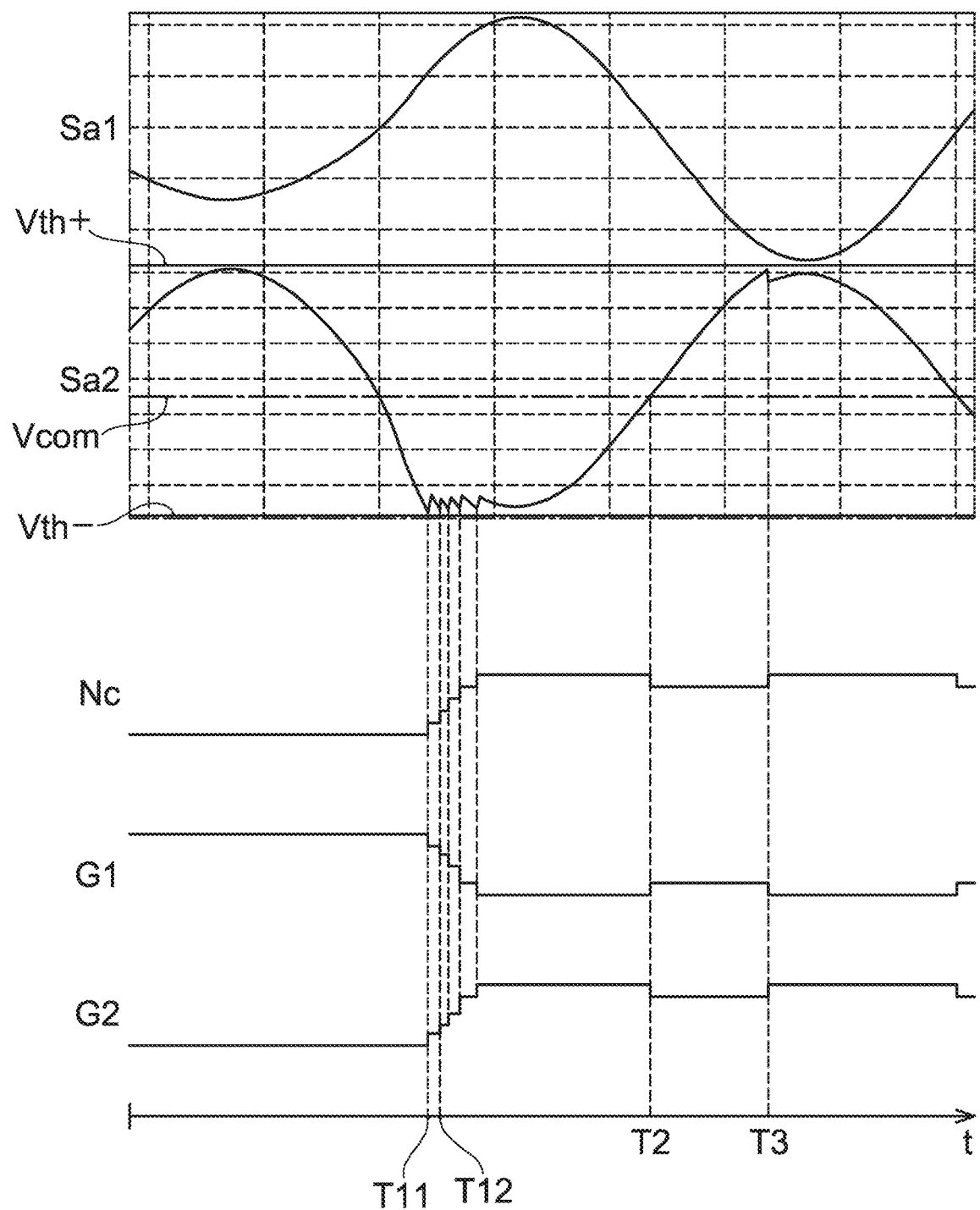
FIG. 6B is a diagram showing a VIB part of FIG. 6A along with changes in gains and a count value with the VIB part enlarged.

FIG. 6A shows one exemplary observation of the waveform of each of the first analog signal Sa1, and the second analog signal Sa2 generated by inputting of the first analog signal Sa1 of the microphone signal module 1 (see FIG. 1) of the present embodiment. FIG. 6A further shows one exemplary observation of the waveform of the output signal So obtained from the AD conversion circuit 3 (see FIG. 1) with respect to the first analog signal Sa1 of FIG. 6A. Besides, the output signal So of FIG. 6A is, as described above with respect to FIG. 8B, the waveform of a signal obtained by passing the digital signal Sd1 (see FIG. 1) output from the AD conversion circuit 3 through a low-pass filter. The first analog signal Sa1 and the second analog signal Sa2 of a VIB part of FIG. 6A are shown in FIG. 6B in an enlarged manner. FIG. 6B further shows one example of changes in the count value Nc of the counter 44 (see FIG. 4) included in the control circuit 4, the first gain G1, and the second gain G2.

As shown in FIG. 6A, in the time domain prior to the time T1, the amplitude of the first analog signal Sa1 is relatively small, so that, by amplifying the first analog signal Sa1 with the first gain G1, the second analog signal Sa2 with an amplitude greater than the amplitude of the first analog signal Sa1 is generated. It is considered that the SN ratio improves by generating the second analog signal Sa2 with a greater amplitude. The first gain G1 at this time can be C11/C22 based on (Equation 1) above described previously with respect to FIG. 2A, for example. Here, C11 is the capacitance of a transducer such as the microphone 11 (see FIG. 2A) and C22 is the capacitance between the input and the output of the buffer circuit 2 of FIG. 2A.

In the time domain up to the time T1, the AD conversion circuit 3 (see FIG. 5B) converts the level of the second analog signal Sa2 to a digital value with the second gain G2 according to the first gain G1. As a result, in the output signal So, the first analog signal Sa1 is reproduced with substantial fidelity.

At the time T1 and thereafter, the amplitude of the first analog signal Sa1 increases, so that the first gain G1 is decreased with respect to the value in the time domain prior to the time T1. In other words, as shown in FIG. 6B, the second analog signal Sa2 reaches the lower limit threshold Vth− at the time T11, so that the count value Nc is incremented. Accordingly, the first gain G1 is decreased with respect to the value up to the time T11. As a result, the amplitude of the second analog signal Sa2 decreases in an amount corresponding to a decrease in the first gain G1, so that signal saturation in the AD conversion circuit 3 does not occur. In addition, the second gain G2 is increased in accordance with incrementing of the count value Nc, so that the second analog signal Sa2 is converted to a digital value of a suitable magnitude.

The level of the first analog signal Sa1 increases even after the time T11, so that the second analog signal Sa2 reaches the lower limit threshold Vth−again at the time T12. Accordingly, the count value Nc is further incremented and the first gain G1 is decreased and the second gain G2 is increased. Therefore, the second analog signal Sa2 continues to be converted to a digital value of a suitable magnitude without saturating. Even after the time T12, the count value Nc is incremented each time the second analog signal Sa2 reaches the lower limit threshold Vth− and in accordance thereto the first gain G1 is decreased and the second gain G2 is increased.

Thereafter, when the second analog signal Sa2 reaches the midpoint potential Vcom at the time T2, the count value Nc is decremented, and, in accordance thereto, the first gain G1 is increased and the second gain G2 is decreased. Thereafter, when the second analog signal Sa2 reaches the upper limit threshold Vth+ at the time T3, the count value Nc is incremented again, and, in accordance thereto, the first gain G1 is decreased and the second gain G2 is increased.

In this way, the first gain G1 and the second gain G2 are controlled, so that, as shown in FIG. 6A, the first analog signal Sa1 is reproduced with substantial fidelity in the output signal So even at or after the time T1. In this way, according to the present embodiment, while ensuring a sufficient dynamic range with a good linearity, a sufficient SN ratio at the time of an input signal (the first analog signal Sa1) with a small amplitude can also be ensured.

<Another Example of AD Conversion Circuit>

Figure 7:
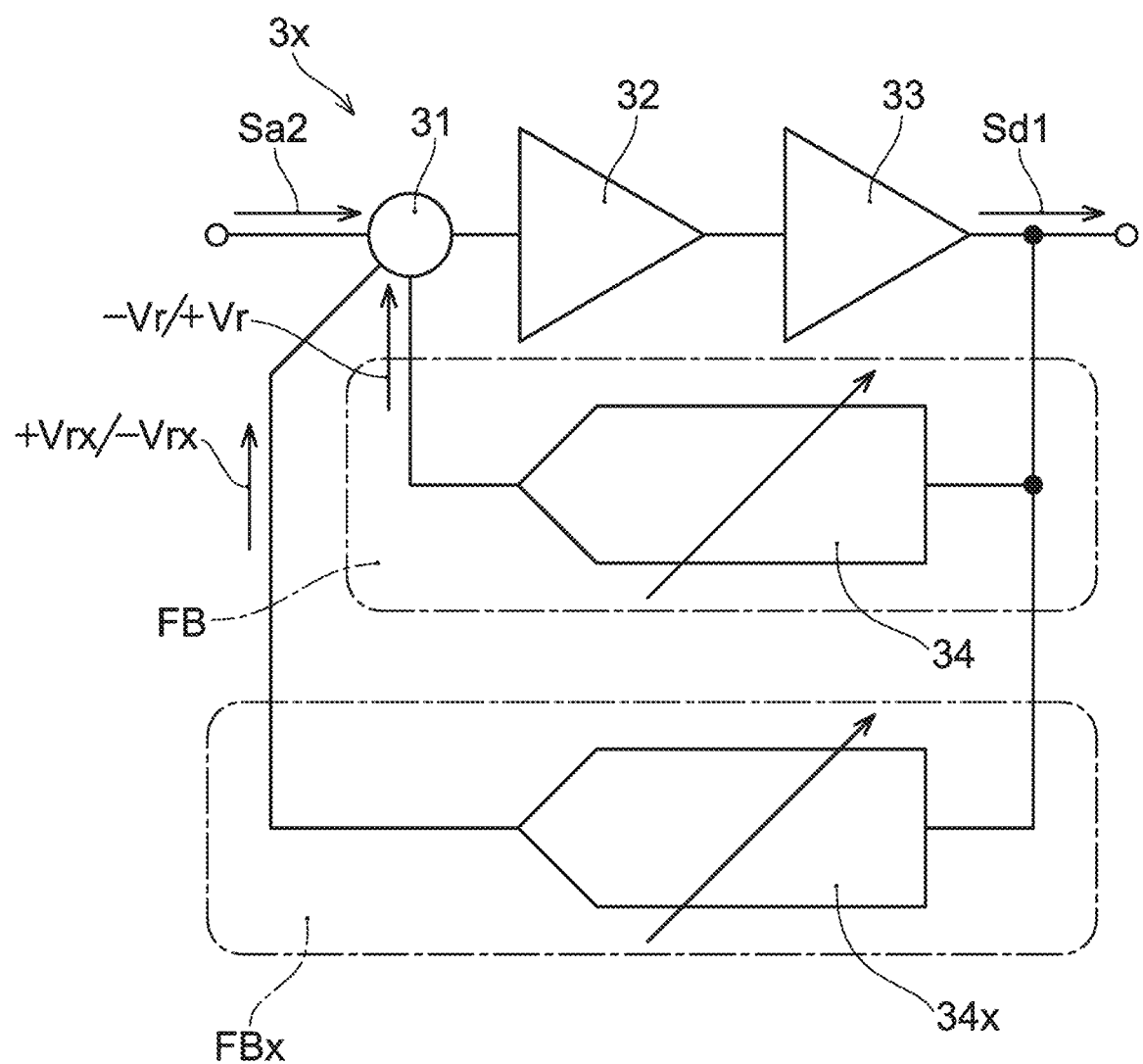
FIG. 7 is a block diagram showing another example of the AD conversion circuit of one embodiment of the present invention.

FIG. 7 shows an AD conversion circuit 3x being another example of the AD conversion circuit of the microphone signal module of the present embodiment. In addition to the AD conversion circuit 3 of FIG. 5A, the AD conversion circuit 3x comprises a second feedback circuit FBx. Primarily, the second feedback circuit FBx is added to compensate for variations in the capacitance of a transducer such as the microphone 11, which transducer is connected to the input terminal of the buffer circuit 2 (see FIGS. 3A and 3B). The AD conversion circuit 3x is suitable to be combined with the non-inverting buffer circuit 2 exemplified in FIGS. 3A and 3B.

In a case that the buffer circuit 2 is a non-inverting type, unlike an inverting type, the second analog signal Sa2, which has, as the polarity with respect to the reference potential Vref (see FIG. 3A), the same polarity as the polarity of the first analog signal Sa1 (see FIG. 3A), is output to the AD conversion circuit 3x from the buffer circuit 2. Accordingly, the DA converter 34 in the AD conversion circuit 3x of FIG. 7 outputs the negative reference voltage −Vr to the subtractor 31 when the output of the quantizer 33 is "positive" and outputs the positive reference voltage (+Vr) to the subtractor 31 when the output of the quantizer 33 is "negative". Therefore, in the subtractor 31, substantially, an absolute value Vr is added when the output of the quantizer 33 is "positive" and the absolute value Vr is subtracted when the output of the quantizer 33 is "negative". By the DA converter 34 operating in this way, a suitable delta-sigma modulation operation on the second analog signal Sa2 from the non-inverting buffer circuit 2 is realized. Besides, also in the example of FIG. 7, the DA converter 34 can operate similarly to the example of FIG. 5A, and, in that case, the subtractor 31 can have the function as an adder to the output from the DA converter 34.

On the other hand, the second feedback circuit FBx is primarily constituted by a DA converter 34x to operate in the same manner as the DA converter 34 of FIG. 5A. In other words, the DA converter 34x outputs the positive reference voltage +Vrx to the subtractor 31 when the output of the quantizer 33 is "positive" and outputs the negative reference voltage −Vrx to the subtractor 31 when the output of the quantizer 33 is "negative". The positive or negative reference voltage (+Vrx or −Vrx) output by the DA converter 34x is subtracted from the second analog signal Sa2 by the subtractor 31 along with the reference voltage (+Vr or −Vr) output from the DA converter 34.

The second feedback circuit FBx is configured to be able to adjust the feedback amount in the same manner as the feedback circuit FB. Therefore, in the same manner as the feedback circuit FB of FIG. 5B, the second feedback circuit FBx can be constituted by a plurality of feedback circuits, each of which comprises a switch and a DA converter. The feedback amount of the second feedback circuit FBx can be adjusted by opening/closing of those switches. The feedback amount of the second feedback circuit FBx is set in accordance with the ratio of the capacitance of a transducer such as the microphone 11, which transducer is connected to the buffer circuit 2 (see FIGS. 3A and 3B), and the input capacitance of the buffer circuit 2. The "input capacitance of the buffer circuit 2" is the capacitance of a capacitive element (such as the capacitor 27 of FIGS. 3A and 3B, for example) connected to the input terminal of the buffer circuit 2, other than the transducer such as the microphone 11.

As disclosed previously, according to (Equation 4) above, the amount of change in the first gain G1 by closing the switch 29 in the buffer circuit 2 of FIGS. 3A and 3B is determined by the ratio of C27 and C11. C11 is the capacitance of a transducer such as the microphone 11, which transducer is connected to the buffer circuit 2. C27 is the capacitance of the capacitor 27 of FIGS. 3A and 3B, and is the input capacitance of the buffer circuit 2. Therefore, to accurately convert the second analog signal Sa2 to a digital signal, it is necessary to compensate for variations in the ratio of the capacitance of the transducer connected to the buffer circuit 2 and the input capacitance of the buffer circuit 2.

On this point, in the example of FIG. 7, as described previously, the second feedback circuit FBx has a feedback amount set in accordance with the ratio of the capacitance of the transducer connected to the buffer circuit 2 and the input capacitance of the buffer circuit 2. Accordingly, the variation in the first gain G1 can be compensated for by the second feedback circuit FBX. Therefore, it is considered that an input analog signal can be accurately converted to a digital signal.

As one example, in a case that the second feedback circuit FBx comprises a plurality of sets of switches and DA converters such as the switches and the DA converters 341 to 34n of the feedback circuit FB of FIG. 5B, the feedback amount of the second feedback circuit FBx can be adjusted by controlling opening/closing of those switches 35. In other words, the variation in the first gain G1 can be compensated for. The feedback amount of the second feedback circuit FBx is determined by measuring the capacitance of the transducer connected to the buffer circuit 2 and the input impedance of the buffer circuit 2 as one example, using a known analog signal. Then, to realize the determined feedback amount, for example, opening/closing of a switch serving such a function as that of the switch 35 of FIG. 5B with respect to the DA converter 34x of the second feedback circuit FBx is controlled. Besides, the feedback amount of the second feedback circuit FBx can also be adjusted by adjusting the reference voltage Vrx using a means other than the adjustment of the capacitance in the second feedback circuit FBx.

Besides, the second gain G2 of the AD conversion circuit 3x also depends on the feedback amount of the second feedback circuit FBx. Therefore, in the example of FIG. 7, the first gain G1 and the second gain G2 do not have to be opposite numbers of each other in decibel representation. For example, the first gain G1 and the second gain G2 can be different from each other in magnification representation with a ratio substantially the same as the ratio of the capacitance of the transducer connected to the buffer circuit 2 and the input capacitance of the buffer circuit 2.

<Comparison with Configuration Other than Embodiment>

As the above-described explanations with reference to FIGS. 1 to 7, in the microphone signal module of the present embodiment, the second gain G2 of the AD conversion circuit 3 is controlled to maintain the linearity by compensating for an increase/decrease in the first gain G1 of the buffer circuit 2 due to control. It is also considered to maintain the linearity by carrying out a processing such as decompression/compression and the like on a digital signal after AD conversion using a DSP (digital signal processor), with respect to such a configuration of the present embodiment.

However, with a signal processing in the digital domain after AD conversion using the DSP and the like, gain switching is carried out at the time of zero crossing of the input analog signal to avoid noise due to DC offset or to ensure signal processing time in the DSP. Accordingly, the first wave immediately after an increase in amplitude of an input signal, such as the output signal Voa of a P1 part shown in FIG. 9, may be clipped (lost). Besides, FIG. 9 shows the waveform of each signal in a case that, in the conventional microphone amplifier 900 of FIG. 8A, a control of the gain of the preamplifier 901 is carried out and an increase/decrease in the gain of the preamplifier 901 due to the control is compensated for by digital processing for the output of the AD converter 910. In the same manner as in FIG. 8B, in FIG. 9, signals Vi, Via, and Voa are one exemplary observations of an input signal of the preamplifier 901 of FIG. 8A, an input signal of the AD converter 910, and an output signal of the AD converter 910 (an analog signal after passing through a suitable low-pass filter), respectively. In FIG. 9, in the output signal Voa, a DC offset Vof is also produced after gain switching of the preamplifier.

Figure 8A:
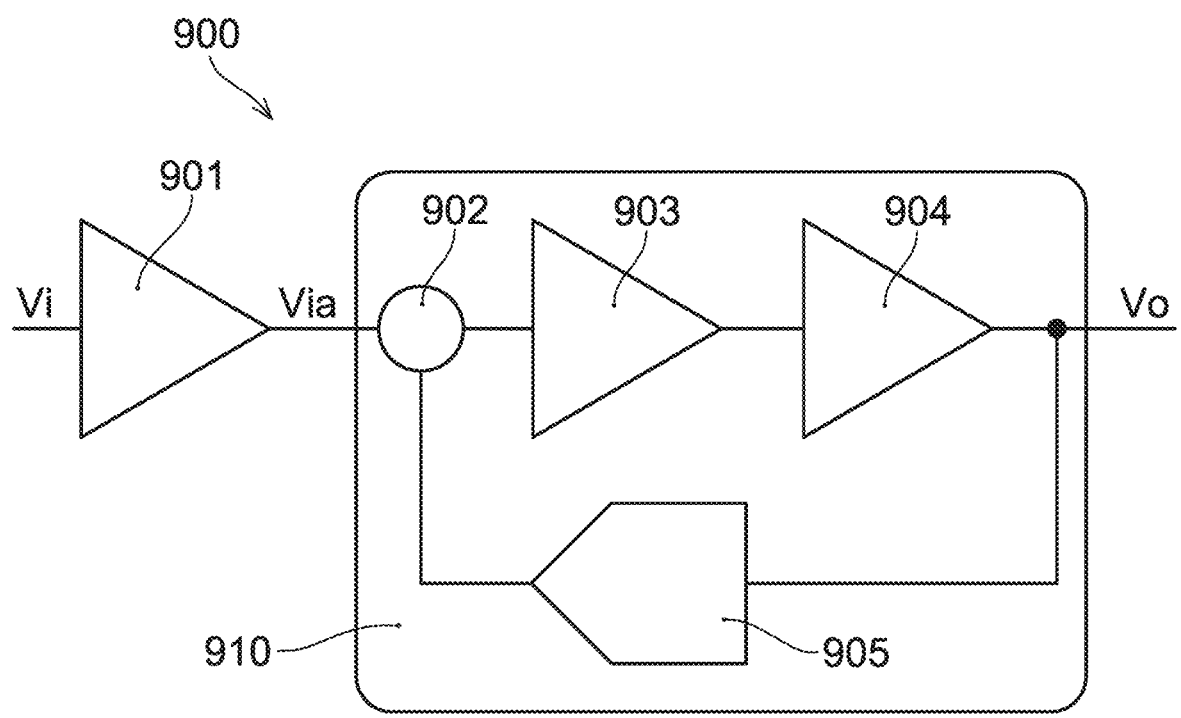
FIG. 8A is a circuit diagram showing one example of a conventional microphone amplifier.
Figure 8B:
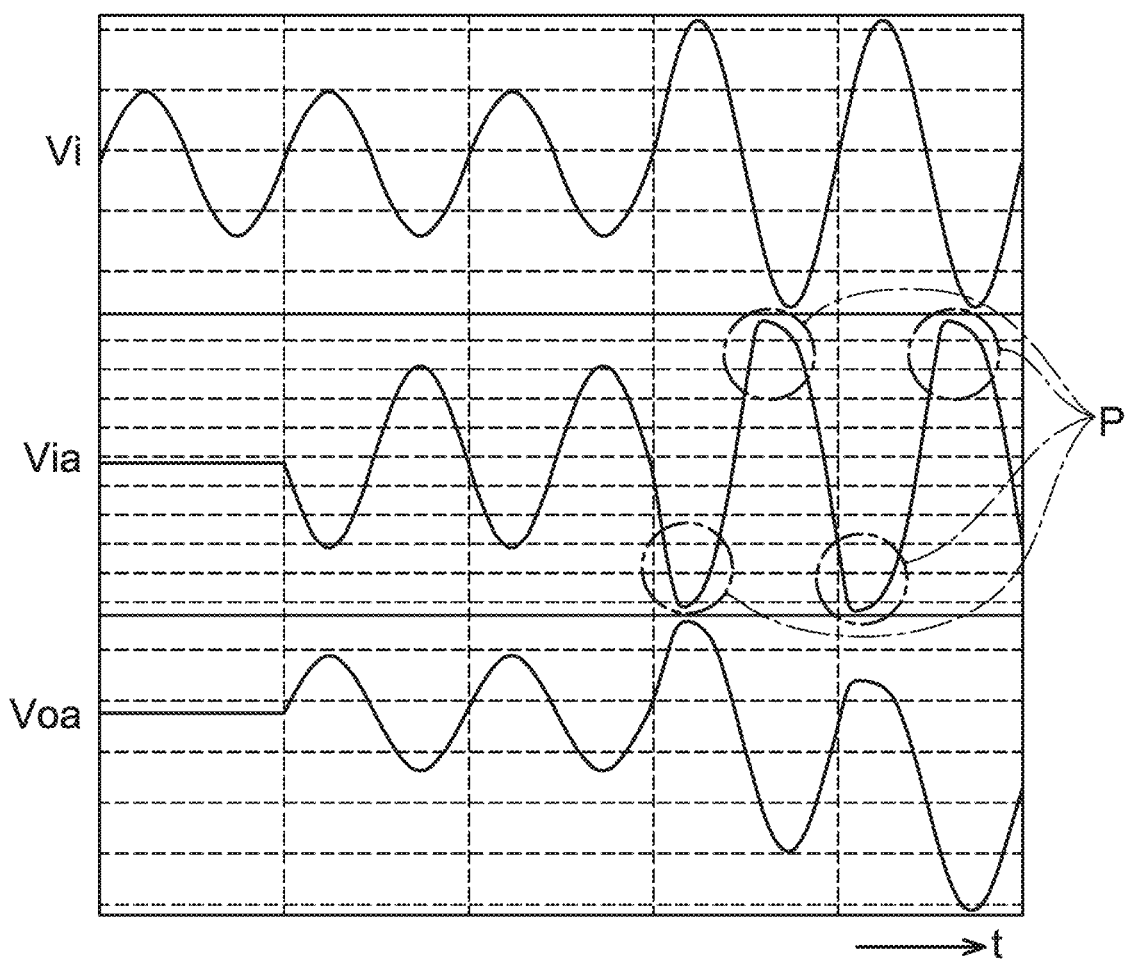
FIG. 8B is a diagram showing a signal waveform of each part of the conventional microphone amplifier of FIG. 8A.
Figure 9:
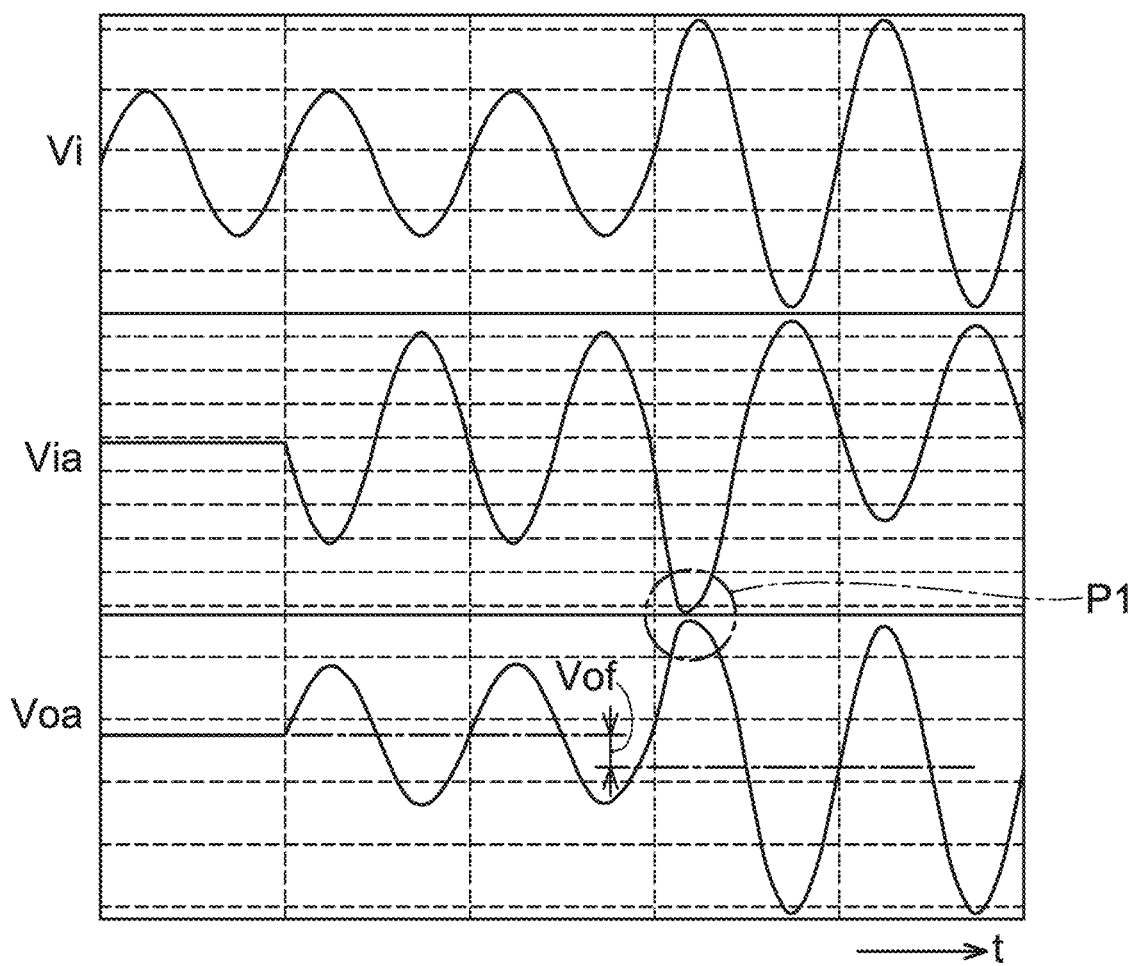
FIG. 9 is a diagram showing one example of a signal waveform of each part of the conventional microphone amplifier when an increase/decrease in gain of a preamplifier is compensated for by digital processing.
Figure 10:
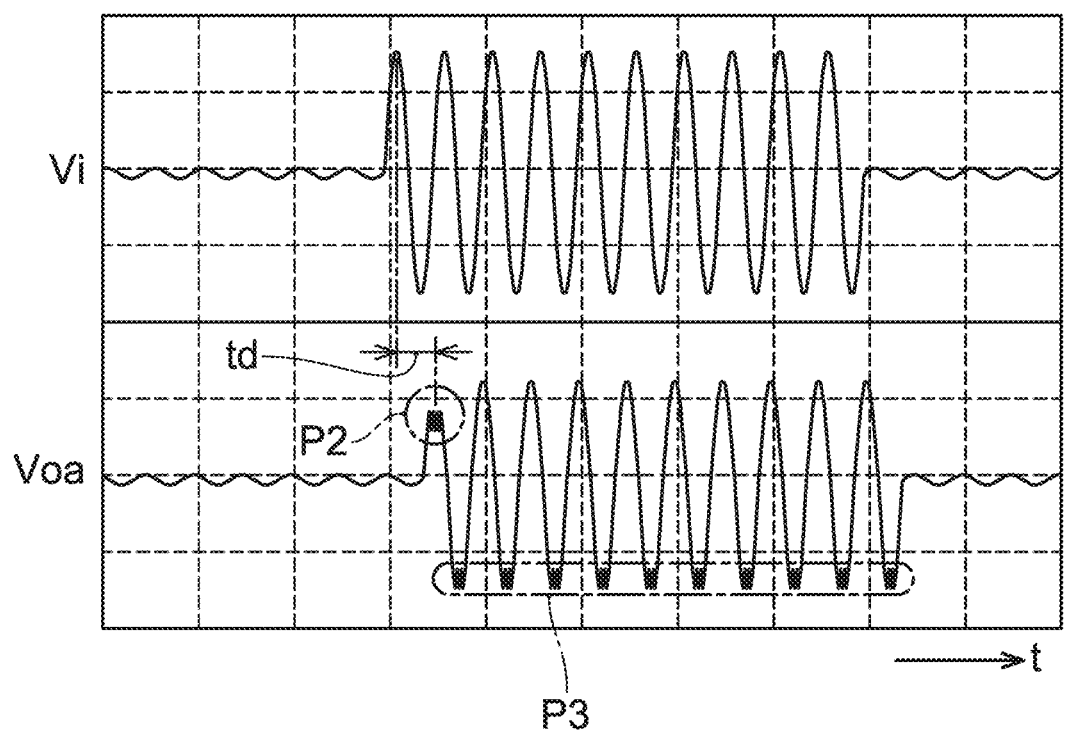
FIG. 10 is a diagram showing another example of the signal waveform of each part of the conventional amplifier when the increase/decrease in gain of the preamplifier is compensated for by digital processing.

Moreover, in FIG. 10, in the same manner as in FIG. 9, another exemplary observations of an input signal Vi and an output signal Voa in a case that digital processing to compensate for an increase/decrease in the gain of the preamplifier 901 in the microphone amplifier 900 of FIG. 8A is carried out is shown. Also in the example of FIG. 10, as shown in a P2 part, the first wave of the output signal Voa is clipped. Also in the time domain at and after the P2 part, clipping occurs in the output signal Voa as shown in a P3 part because of the excess of the input voltage range of the AD converter 910 due to the DC offset. Furthermore, a delay td occurs between the input signal Vi and the output signal Voa. The defects shown in FIGS. 9 and 10 can be avoided by providing a circuit for cancelling a DC offset and the like, but an addition of such a circuit would make the microphone amplifier 900 of FIG. 8A larger.

On the other hand, in the present embodiment, an increase/decrease in the first gain G1 of the buffer circuit 2 due to control is compensated for in the analog domain by controlling the second gain G2 of the AD conversion circuit 3. Both the first gain G1 and the second gain G2 are controlled in the analog domain, so that the first gain G1 and the second gain G2 can be controlled in substantially real time or at a very high frequency of several MHz relative to an audio signal. Accordingly, a signal delay is unlikely to occur, and, thus, distortion of the waveform, such as clipping due to a signal delay, is also unlikely to occur. Moreover, the circuit size can be reduced since the DSP is not used, and current consumption during operation can also be saved. While providing these advantages, it may also be possible to obtain performance being equal to or better than that at the time of using the DSP.

<Comparison with Another Configuration of Buffer Circuit>

Figure 11A:
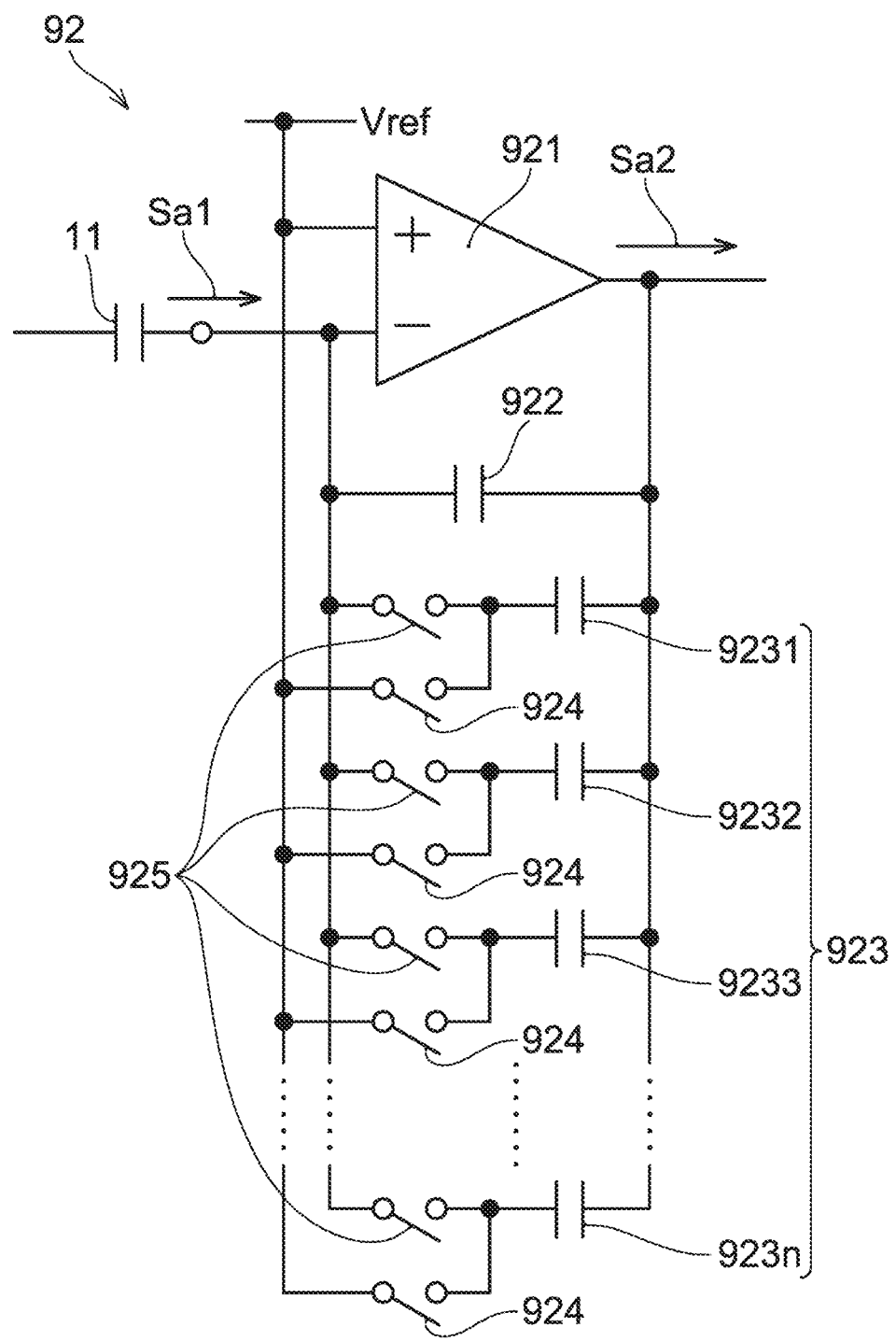
FIG. 11A is a circuit diagram showing a comparative example with respect to the buffer circuit of the microphone signal conversion module of the embodiment.
Figure 11B:
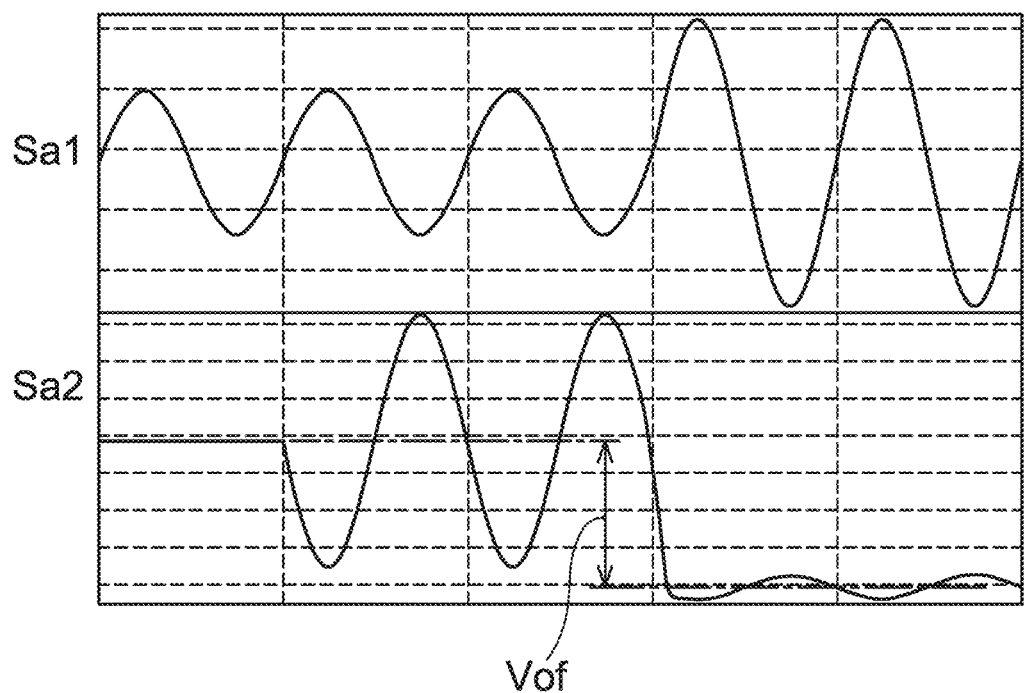
FIG. 11B is a diagram showing one example of a signal waveform using the buffer circuit of FIG. 11A.

FIG. 11A shows, as a comparative example, a buffer circuit 92 having a configuration different from that of the buffer circuit 2 exemplified in FIGS. 2B and 3B. Then, FIG. 11B shows one example of the first analog signal Sa1 and the second analog signal Sa2 when the buffer circuit 92 is used for the microphone signal module of the embodiment instead of the buffer circuit 2 of FIG. 2B. The buffer circuit 92 comprises an operational amplifier 921, a capacitor 922, 923, a plurality of switches 924, and a plurality of switches 925. The operational amplifier 921, the capacitor 922, 923 (the capacitors 9231 to 923n), and the switches 925 function in the same manner as the operational amplifier 21, the capacitor 22, 23, and the switches 25, respectively, of the buffer circuit 2 of FIG. 2B. On the other hand, each of the switches 924 connects or separates any one of the capacitors 9231 to 923n, and the non-inverting input terminal of the operational amplifier 921, to which non-inverting input terminal the reference potential Vref is applied. Also in the buffer circuit 92, the gain of the buffer circuit 92 can be controlled by opening/closing of each of the switches 925.

Moreover, in the buffer circuit 92, a capacitor separated from the inverting input terminal of the operational amplifier 921 by the switch 925, among the capacitors 9231 to 923n, is charged by closing the switch 924. In this way, a drastic fluctuation of an output signal of the buffer circuit 92 at the time of switching the gain is suppressed, making it possible to decrease the so-called pop noise. However, a charge amount stored between the output terminal and the inverting input terminal of the operational amplifier 921 changes at the time of switching of the gain, so that a DC offset Vof is produced in the second analog signal Sa2, as shown in FIG. 11B. Besides, a noticeable attenuation of the amplitude after the DC offset is produced in the second analog signal Sa2 of FIG. 11B is due to the second analog signal Sa2 having the DC offset being misidentified as a large amplitude signal by the control circuit 4 (see FIG. 1). Such a DC offset can be prevented by switching the gain at the time of zero crossing of the second analog signal Sa2, for example. However, if there is such a restriction on the gain switching timing, clipping of a signal as described previously may occur due to a delay in switching.

Contrarily thereto, in the buffer circuit 2 shown in FIG. 2B or 3B, switching timing of the gain G1 is not subjected to a restriction for the DC offset suppression, so that the delay in switching, or an occurrence of clipping of the signal along therewith can be suppressed.

REFERENCE SIGNS LIST

1 MICROPHONE SIGNAL CONVERSION MODULE (MICROPHONE SIGNAL MODULE)
10 MICROPHONE MODULE
11 MICROPHONE
2 BUFFER CIRCUIT
21 OPERATIONAL AMPLIFIER
22 CAPACITOR
23 VARIABLE CAPACITANCE CAPACITOR
24, 25 SWITCH
26 NON-INVERTING BUFFER
27 VARIABLE CAPACITANCE CAPACITOR
28, 29 SWITCH
3, 3x AD CONVERSION CIRCUIT
34, 34x, 340, 341 to 34n DA CONVERTER
4 CONTROL CIRCUIT
40 COMPARISON CIRCUIT
44 COUNTER
45 DETECTOR (COMPARATOR)
47 PULSE GENERATION CIRCUIT
471 TIMER
472 PULSE GENERATOR
FB FEEDBACK CIRCUIT
FBX SECOND FEEDBACK CIRCUIT
G1 FIRST GAIN
G2 SECOND GAIN
Sa1 FIRST ANALOG SIGNAL
Sa2 SECOND ANALOG SIGNAL

Pr PULSE
VCOM MIDPOINT POTENTIAL
VTH+ UPPER LIMIT THRESHOLD
VTH− LOWER LIMIT THRESHOLD

The invention claimed is:

1. A microphone signal conversion module, the module comprising:
a buffer circuit to carry out a level conversion with a first gain on a first analog signal input from a transducer and to output a second analog signal obtained by the level conversion;
an analog-to-digital conversion circuit to convert a level of the second analog signal with a second gain to a digital value; and
a control circuit to control the first gain and the second gain, wherein the second analog signal is input to the control circuit, and
the control circuit is configured to control a magnitude of each of the first gain and the second gain in mutually opposite directions based on a level of the second analog signal;
wherein the control circuit comprises:
a comparison circuit to compare a level of the second analog signal with a predetermined upper limit threshold and a predetermined lower limit threshold;
a detector to detect an inversion of a magnitude relationship between a level of the second analog signal and a midpoint potential of a maximum amplitude of the second analog signal; and
a counter to be incremented when a level of the second analog signal is detected by the comparison circuit being outside a range from the lower limit threshold to the upper limit threshold and to be decremented when the inversion is detected by the detector; and
wherein the control circuit is configured to control the first gain and the second gain in accordance with a count value of the counter.

2. The microphone signal conversion module according to claim 1,
wherein the buffer circuit comprises:
an operational amplifier comprising an inverting input terminal to receive the first analog signal;
a plurality of capacitors arranged between an output terminal of the operational amplifier and the inverting input terminal, and
a switch to connect or separate some of the plurality of capacitors, and the inverting input terminal; and
wherein the control circuit is configured to control the first gain by opening and closing the switch.

3. The microphone signal conversion module according to claim 2,
wherein the some of the plurality of capacitors are configured to discharge when separated from the inverting input terminal by the switch.

4. The microphone signal conversion module according to claim 1,
wherein the buffer circuit comprises:
a non-inverting buffer comprising an input terminal to receive the first analog signal sent from a capacitive transducer;
a plurality of capacitors, each of which is arranged between the input terminal and a predetermined fixed potential; and
a switch to connect or separate each of the plurality of capacitors, and the input terminal; and
wherein the control circuit is configured to control the first gain by opening and closing the switch.

5. The microphone signal conversion module according to claim 4,
wherein the plurality of capacitors is configured to discharge when separated from the input terminal by the switch.

6. The microphone signal conversion module according to claim 1,
wherein the control circuit further comprises a pulse generation circuit to output a pulse when a predetermined time elapses from detection of the inversion by the detector; and
wherein the counter is configured to decrement the count value each time the pulse is output.

7. A microphone signal conversion module, the module comprising:
a buffer circuit to carry out a level conversion with a first gain on a first analog signal input from a transducer and to output a second analog signal obtained by the level conversion;
an analog-to-digital conversion circuit to convert a level of the second analog signal with a second gain to a digital value; and
a control circuit to control the first gain and the second gain, wherein the second analog signal is input to the control circuit, and
the control circuit is configured to control a magnitude of each of the first gain and the second gain in mutually opposite directions based on a level of the second analog signal;
wherein the analog-to-digital conversion circuit is a delta-sigma type analog-to-digital conversion circuit comprising a feedback circuit configured with a digital-to-analog converter; and
wherein the control circuit is configured to control the second gain by increasing and decreasing a feedback amount of the feedback circuit; and
wherein the analog-to-digital conversion circuit further comprises a second feedback circuit having a feedback amount set in accordance with a ratio of a capacitance of a transducer connected to the buffer circuit and an input capacitance of the buffer circuit.

8. A microphone module comprising:
the microphone signal conversion module according to claim 1, and
a MEMS transducer to generate the first analog signal.

9. A microphone module comprising:
the microphone signal conversion module according to claim 2, and
a MEMS transducer to generate the first analog signal.

10. A microphone module comprising:
the microphone signal conversion module according to claim 3, and
a MEMS transducer to generate the first analog signal.

11. A microphone module comprising:
the microphone signal conversion module according to claim 4, and
a MEMS transducer to generate the first analog signal.

12. A microphone module comprising:
the microphone signal conversion module according to claim 5, and
a MEMS transducer to generate the first analog signal.

13. A microphone module comprising:
the microphone signal conversion module according to claim 6, and
a MEMS transducer to generate the first analog signal.

14. A microphone module comprising:
the microphone signal conversion module according to claim 7, and
a MEMS transducer to generate the first analog signal.

\* \* \* \* \*